United States Patent
Okano

(10) Patent No.: US 7,394,334 B2
(45) Date of Patent: Jul. 1, 2008

(54) DIELECTRIC RESONANCE APPARATUS, OSCILLATION APPARATUS, AND TRANSMISSION/RECEPTION APPARATUS

(75) Inventor: Takeshi Okano, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 11/761,432

(22) Filed: Jun. 12, 2007

(65) Prior Publication Data

US 2007/0229197 A1 Oct. 4, 2007

Related U.S. Application Data

(63) Continuation of application No. PCT/JP05/23578, filed on Dec. 22, 2005.

(30) Foreign Application Priority Data

Jan. 11, 2005 (JP) ............................. 2005-004200

(51) Int. Cl.
 H01P 5/12 (2006.01)
 H01P 7/10 (2006.01)
 H01P 3/08 (2006.01)
(52) U.S. Cl. ...................... 333/134; 333/204; 333/219.1
(58) Field of Classification Search .......... 333/134.204, 333/205, 219, 219.1
See application file for complete search history.

(56) References Cited

U.S. PATENT DOCUMENTS 5,710,105 A * 1/1998 Shen ........................... 505/210
5,914,296 A * 6/1999 Shen ........................... 505/210
5,920,243 A * 7/1999 Ishikawa et al. ............. 333/204
6,111,485 A * 8/2000 Carlsson et al. ............. 333/99 S

FOREIGN PATENT DOCUMENTS

| JP | 4-233802 | 8/1992 |
|---|---|---|
| JP | 07-336106 | 12/1995 |
| JP | 10-270909 | 9/1998 |
| JP | 10-290104 | 10/1998 |
| JP | 11-234009 | 8/1999 |
| JP | 2000-502231 | 2/2000 |
| WO | WO 97/23012 | 6/1997 |
| WO | WO 02/078119 | 10/2002 |

OTHER PUBLICATIONS

PCT/JP2005/023578, Copy of International Search Report dated Jan. 31, 2006.
PCT/JP2005/023578, Copy of Written Opinion dated Jan. 31, 2006.

* cited by examiner

Primary Examiner—Robert J. Pascal
Assistant Examiner—Kimberly E Glenn
(74) Attorney, Agent, or Firm—Dickstein Shapiro LLP

(57) ABSTRACT

A substantially circular electrode 3 is arranged on a surface 2A of a dielectric substrate 2 of a TM010-mode resonator 1. A coupling line 5, which extends along a diameter of the substantially circular electrode 3, is arranged on a back surface 2B of the dielectric substrate 2, and back-surface electrodes 7 are arranged with the coupling line 5 interposed therebetween in the width direction. Furthermore, signal lines 11 and ground electrodes 13 are arranged on a surface of an external substrate 10 in positions other than portions facing the coupling line 5 of the TM010-mode resonator 1. The signal lines 11 are connected to the coupling line 5 of the TM010-mode resonator 1 and the ground electrodes 13 is connected to the back-surface electrodes 7.

18 Claims, 20 Drawing Sheets

DIELECTRIC RESONANCE APPARATUS, OSCILLATION APPARATUS, AND TRANSMISSION/RECEPTION APPARATUS

This is a continuation of application Ser. No. PCT/JP05/23578, filed Dec. 22, 2005.

TECHNICAL FIELD

The present invention relates to dielectric resonance apparatuses which oscillate high-frequency electro-magnetic waves such as microwaves and millimeter waves, oscillation apparatuses using the dielectric resonance apparatuses, and transmission/reception apparatuses.

BACKGROUND ART

In general, a known dielectric resonance apparatus includes a resonator having a circular electrode on a surface of a dielectric substrate and power-supply lines which are arranged on the dielectric substrate and which are arranged in the vicinity of ends of the resonator (see, for example, Patent Document 1).

Furthermore, a known oscillation apparatus using a dielectric resonance apparatus includes an oscillator block which oscillates signals having predetermined oscillation frequencies and a dielectric resonator block constituted by a TM010-mode resonator used for setting the oscillation frequencies (see, for example, Patent Document 2). In such an oscillation apparatus, the oscillator block and the dielectric resonator block are separately configured using dielectric substrates. In addition, the dielectric constants and the thicknesses of the dielectric substrates are suitably set for the oscillator block and the dielectric resonator block. Accordingly, a substrate having a low dielectric constant is used for the oscillator block, for example, whereby the accuracy of dimension is relatively enhanced. On the other hand, a substrate having a high dielectric constant and a large thickness is used for the dielectric resonator block, whereby the Q factor is enhanced. Furthermore, mass production of the oscillator apparatus is facilitated by using of the oscillator block and the resonator block in combination.

A known waveguide dielectric resonator includes a substantially cuboid dielectric block (see, for example, Patent Document 3). Such a dielectric resonator includes an input/output electrode having a short-circuit point connected to a ground electrode so as to face a surface on which the dielectric block is implemented. Furthermore, the dielectric resonator is excited using the input/output electrode.

Patent Document 1: Japanese Unexamined Patent Application Publication No. 7-336106

Patent Document 2: Japanese Unexamined Patent Application Publication No. 11-234009

Patent Document 3: International Publication No. WO 2002/078119 pamphlet

In Patent Document 1, the distance between each of the power-supply lines and the ground is set to be larger than the distance between the resonator and the ground so that the power-supply lines and the resonator are strongly coupled with each other. In this case, the thickness of the dielectric resonance apparatus tends to be large since a large space is necessary in the thickness direction of the dielectric substrate, for example, so that a large distance between each of the power-supply lines and the ground surrounding the power-supply lines is ensured. Furthermore, since the power-supply lines are arranged outside of the resonator, the area of the dielectric resonance apparatus also tends to be large. Accordingly, the size of the dielectric resonance apparatus is increased.

In Patent Document 2, a frequency control circuit for controlling the oscillation frequency and a terminating resistor are arranged on the dielectric substrate of the dielectric resonator block. Since the dielectric substrate used for the dielectric resonator block has a high dielectric constant, the cost tends to be increased, and furthermore, the area of the dielectric substrate tends to be increased. This leads to the problem that the production cost of the oscillation apparatus is increased.

Moreover, in Patent Document 3, since a waveguide dielectric resonator is used, the electric characteristics of the resonator is determined in accordance with the length and width of the dielectric block. As processing methods of the dielectric block, a method for processing the dielectric block by baking after injection molding and a method for processing the dielectric block by cutting (dicing) after baking of a dielectric body have been proposed. However, such processing methods lead to large manufacturing error, and therefore, the desired accuracy of dimension is not obtained. Accordingly, it is necessary to enhance accuracies of the length and the width of the dielectric block by performing polishing after formation of the dielectric block, resulting in increased production cost. Furthermore, since an input/output electrode is arranged on the dielectric block which should be subjected to high-accuracy outer-shape processing, the amount of coupling between the dielectric resonator and the input/output electrode is changed if the dielectric block and the input/output electrode are slightly displaced with respect to each other. Consequently, variation of amounts of coupling between individual dielectric resonators and corresponding input/output electrodes is likely to be generated, and variation of the electric characteristics of the resonators becomes large.

DISCLOSURE OF INVENTION

Accordingly, it is an object of the present invention to provide a dielectric resonance apparatus, an oscillation apparatus, and a transmission/reception apparatus, which are compact and have stable electric characteristics while production costs thereof are reduced.

In order to achieve the above-described object, a dielectric resonance apparatus according to the present invention includes a TM010-mode resonator including a dielectric substrate having electrodes arranged on a surface and a back surface thereof, the electrode arranged on the surface being a substantially circular electrode, an external substrate implemented on a plane of the back surface of the dielectric substrate so as to face the back surface of the dielectric substrate of the TM010-mode resonator, and signal lines which are arranged on the external substrate and which are connected to the TM010-mode resonator. In the dielectric resonance apparatus, a magnetic-field coupling section for magnetically coupling with the TM010-mode resonator by being connected to the signal lines is arranged on the back surface of the dielectric substrate.

According to the present invention, since the magnetic-field coupling section connected to the signal lines is arranged on the back surface of the dielectric substrate of the TM010-mode resonator, a magnetic field generated in the magnetic-field coupling section is made to coincide with a magnetic field generated in the TM010-mode resonator whereby the magnetic-field coupling section is magnetically coupled with the TM010-mode resonator. Accordingly, the TM010-mode resonator and the signal lines are connected with each other using the magnetic-field coupling section, and the TM010-mode resonator is excited by high-frequency signals supplied to the signal lines.

Since an electrode arranged on the back surface of the dielectric substrate serves as a magnetic-field coupling section, the electrode serving as a magnetic-field coupling section may be formed simultaneously (together) with the back-surface electrodes included in the TM010-mode resonator. Accordingly, the variation of an amount of coupling between the TM010-mode resonator and the magnetic-field coupling section may be reduced and the electrical characteristics of the individual TM010-mode resonators may be kept constant. Furthermore, since the magnetic-field coupling section is arranged in a position facing the substantially circular electrode, the TM010-mode resonator may be made smaller compared to the case where the magnetic-field coupling section is magnetically coupled with the TM010-mode resonator in a position facing the outside of the substantially circular electrode.

In the TM010-mode resonator, electrical characteristics of the TM010-mode resonator re determined in accordance with the substantially circular electrode, the back-surface electrodes and the thickness T1 of the dielectric substrate, which constitute the TM010-mode resonator. Accordingly, since the magnetic-field coupling section and the back-surface electrodes are simultaneously formed, a stable coupling characteristic may be easily obtained. As a result, the fabrication cost may be reduced when compared to the case where a waveguide dielectric resonance apparatus for which high-accuracy processing is difficult is employed. Furthermore, since the magnetic-field coupling section has a stable coupling characteristic with respect to the TM010-mode resonator, a frequency control circuit and the like need not be arranged on the dielectric substrate of the TM010-mode resonator, but may be arranged on the external substrate. Since the frequency control circuit may be removed from the dielectric substrate, the TM010-mode resonator may be miniaturized.

According to the present invention, the magnetic-field coupling section located on the back surface of the dielectric substrate may extend through a position facing the substantially circular electrode toward an end portion of the dielectric substrate, and may be constituted by a coupling line having opposite ends electrically connected to the signal lines arranged on the external substrate. Furthermore, the back-surface electrodes arranged on the back surface of the dielectric substrate may be located on either side of the coupling line in a width direction and a gap may be provided so as to surround the coupling line.

In the case where the coupling line, which extends so as to pass through a position facing the substantially circular electrode, serves as a magnetic-field coupling section, and opposite ends thereof are connected to the signal lines arranged on the external substrate, the TM010-mode resonator is connected in parallel to a circuit arranged on the external substrate having the signal lines thereon. In this case, for example, a magnetic field having a direction which is the same as that of the circular magnetic field generated in the dielectric substrate of the TM010-mode resonator is generated around the coupling line by supplying a high-frequency signal having a resonant frequency to the coupling line. Since the coupling line and the TM010-mode resonator are magnetically coupled with each other, the high-frequency signal supplied from one of the opposite ends of the coupling line is reflected by the TM010-mode resonator. Consequently, a reaction resonator is formed.

In the present invention, the coupling line may pass through an axis of the substantially circular electrode.

Since the coupling line passes through the axis of the substantially circular electrode, the current loss due to existence of the coupling line may be reduced when compared with the case where the coupling line is arranged in any other position. That is, when the TM010-mode resonator is made to resonate, the resonant current is radially supplied toward the axis of the substantially circular electrode. If a configuration in which the coupling line is arranged so as to pass through a position other than the axis of the substantially circular electrode is employed, the current loss of the TM010-mode resonator is increased since the resonant current is interrupted by the gap arranged so as to surround both sides of the coupling line. On the other hand, since the coupling line is arranged so as to pass through the axis of the substantially circular electrode, in the present invention, the resonant current is not interrupted by a gap surrounding both sides of the coupling line and the current loss due to the existence of the coupling line is reduced.

In the present invention, the coupling line defines the amount of coupling with the TM010-mode resonator in accordance with the width of the coupling line. Since the amount of coupling with the TM010-mode resonator is set in accordance with the width of the coupling line, the magnetic field generated around the coupling line is expanded and therefore an amount of coupling can be increased by setting the value of the width of the coupling line larger, whereas the magnetic field generated around the coupling line is reduced and therefore the amount of coupling is reduced by setting the value of the width of the coupling line smaller. Accordingly, the amount of coupling between the coupling line and the TM010-mode resonator may be controlled to a desired value in accordance with the width of the coupling line. The degree of freedom of design is enhanced.

The gap between the coupling line and each of the back-surface electrodes may define the amount of coupling with the TM010-mode resonator in accordance with the width of the gap.

Since the amount of coupling with the TM010-mode resonator is set in accordance with the width of the gap between the coupling line and each of the back-surface electrodes, according to the present invention, the magnetic field generated around the coupling line is expanded and therefore the amount of coupling can be increased by setting the value of the width of the gap larger, whereas the magnetic field generated around the coupling line is reduced and therefore the amount of coupling is reduced by setting the value of the width of the gap smaller. Accordingly, the amount of coupling between the coupling line and the TM010-mode resonator may be controlled to a desired value in accordance with the width of the gap. The degree of freedom of design is enhanced.

In the present invention, signal lines and a ground electrode may be arranged on the external substrate in portions other than portions facing the coupling line of the TM010-mode resonator. The signal lines may be connected to end portions of the coupling line of the TM010-mode resonator using bumps. The ground electrode may be connected to a back-surface electrode of the TM010-mode resonator using the bumps.

Since signal lines and a ground electrode are arranged on the external substrate in portions other than portions facing the coupling line of the TM010-mode resonator, according to the present invention, the ground electrodes on the external substrate and the like are not arranged around the coupling line when the TM010-mode resonator is implemented on the external substrate. Accordingly, even if a variation in the heights of the bumps is generated when the coupling line and the back-surface electrodes on the TM010-mode resonator are connected to the signal lines and the ground electrodes on the external substrate, respectively, using the bumps, the magnetic field generated around the coupling line is not influenced by the ground electrodes of the external substrate. Consequently, even if the variation of the heights h of the bumps is generated, the amount of coupling between the TM010-mode resonator and the coupling line is kept constant, that is, stable coupling is achieved.

Furthermore, in the present invention, the back-surface electrode arranged on the back surface of the dielectric substrate may be arranged so as to face the substantially circular electrode. Furthermore, the magnetic-field coupling section may be constituted by coupling electrodes having open portions and short-circuit points, each of the short-circuit points which is included in a corresponding one of the coupling electrodes being surrounded by the corresponding one of the open portions. Moreover, each of the coupling electrodes may be electrically connected to the signal lines arranged on the external substrate.

With this configuration, the TM010-mode resonator is connected in series to circuits arranged on a surface of the external substrate on which the signal lines are arranged. Accordingly, a TM010-mode resonator including a coupling electrode functions as a reaction resonator, and a TM010-mode resonator including two coupling electrodes functions as a bandpass resonator. Consequently, the TM010-mode resonator allows a high-frequency signal supplied to one of the coupling electrodes from a corresponding one of the signal lines of the external substrate to pass at the resonant frequency of the TM010-mode resonator and reflects the high-frequency signal at other frequencies.

In an embodiment, U-shaped opening portions may be arranged on the back-surface electrode. Furthermore, the coupling electrodes may have tips surrounded by the corresponding U-shaped opening portions and connected to the corresponding signal lines arranged on the external substrate, and may have base ends which are connected to the back-surface electrode and serve as short-circuit points.

With this configuration, the tips of the coupling electrodes, which are open ends, allow high-frequency signals to be supplied, and magnetic fields having large magnitudes are generated around the base ends of the coupling electrodes serving as the short-circuit points so that the coupling electrodes and the TM010-mode resonator are magnetically coupled with each other.

In the present invention, the coupling electrodes may define the amount of coupling with the TM010-mode resonator in accordance with a distance between a portion where a magnitude of a magnetic field of the TM010-mode resonator is large and the short-circuit points.

Since an amount of coupling with the TM010-mode resonator is set in accordance with a distance between a portion where a magnitude of a magnetic field of the TM010-mode resonator is large and the short-circuit points, according to the present invention, the amount of coupling is increased by changing the position of the short-circuit points so as to be close to the position where the magnitude of the magnetic field generated in the TM010-mode resonator is large, whereas the amount of coupling is reduced by changing the position of the short-circuit points so as to be far away from the position where a magnitude of the magnetic field generated in the TM010-mode resonator is large. Accordingly, the amount of coupling with the TM010-mode resonator may be controlled to be a desired amount in accordance with the position of the short-circuit points. Hence, the degree of freedom of design is enhanced.

In the present invention, the open portions may define an amount of coupling with the TM010-mode resonator in accordance with gap widths of portions located on either side of the corresponding short-circuit points of the coupling electrodes.

Since the amount of coupling with TM010-mode resonator is set in accordance with a width of the gap included in the open portion, according to the present invention, the amount of coupling is increased by setting the value of the gap width included in each of the open portions larger, whereas the magnetic field generated around the short-circuit points is reduced and therefore an amount of coupling is reduced by setting the value of the gap width included in each of the open portions smaller. Accordingly, the amount of coupling between the coupling electrodes and the TM010-mode resonator may be controlled to a desired value in accordance with the gap width included in each of the open portions. The degree of freedom of design is enhanced.

In the present invention, another magnetic-field coupling section may be arranged on the back surface of the dielectric substrate of the TM010-mode resonator, and the other magnetic-field coupling section may have a short-circuit point which is surrounded by an open portion arranged on the back-surface electrode.

Since another magnetic-field coupling section is arranged on the back surface of the dielectric substrate of the TM010-mode resonator and the other magnetic-field coupling section has a short-circuit point which is surrounded by an open portion arranged on the back-surface electrode, for example, in a state where a reaction resonator is constituted by the coupling line (a first magnetic-field coupling section), according to the present invention, the reaction band of the reaction resonator may be controlled using a frequency control circuit unit by connecting the frequency control circuit unit to the coupling electrode (second magnetic-field coupling section) including the short-circuit point. Accordingly, a reaction voltage control oscillator is configured by connecting the oscillation circuit to the coupling line and by connecting the frequency control circuit unit to the coupling electrode including the short-circuit point.

An oscillation apparatus and a transmission/reception apparatus may be configured utilizing the dielectric resonance apparatus according to the present invention.

Since the dielectric resonance apparatus is miniaturized and has a stable coupling characteristic, the oscillation apparatus and a transmission/reception apparatus using the dielectric resonance apparatus may be made compact while stable characteristics thereof are achieved.

Figure 1:
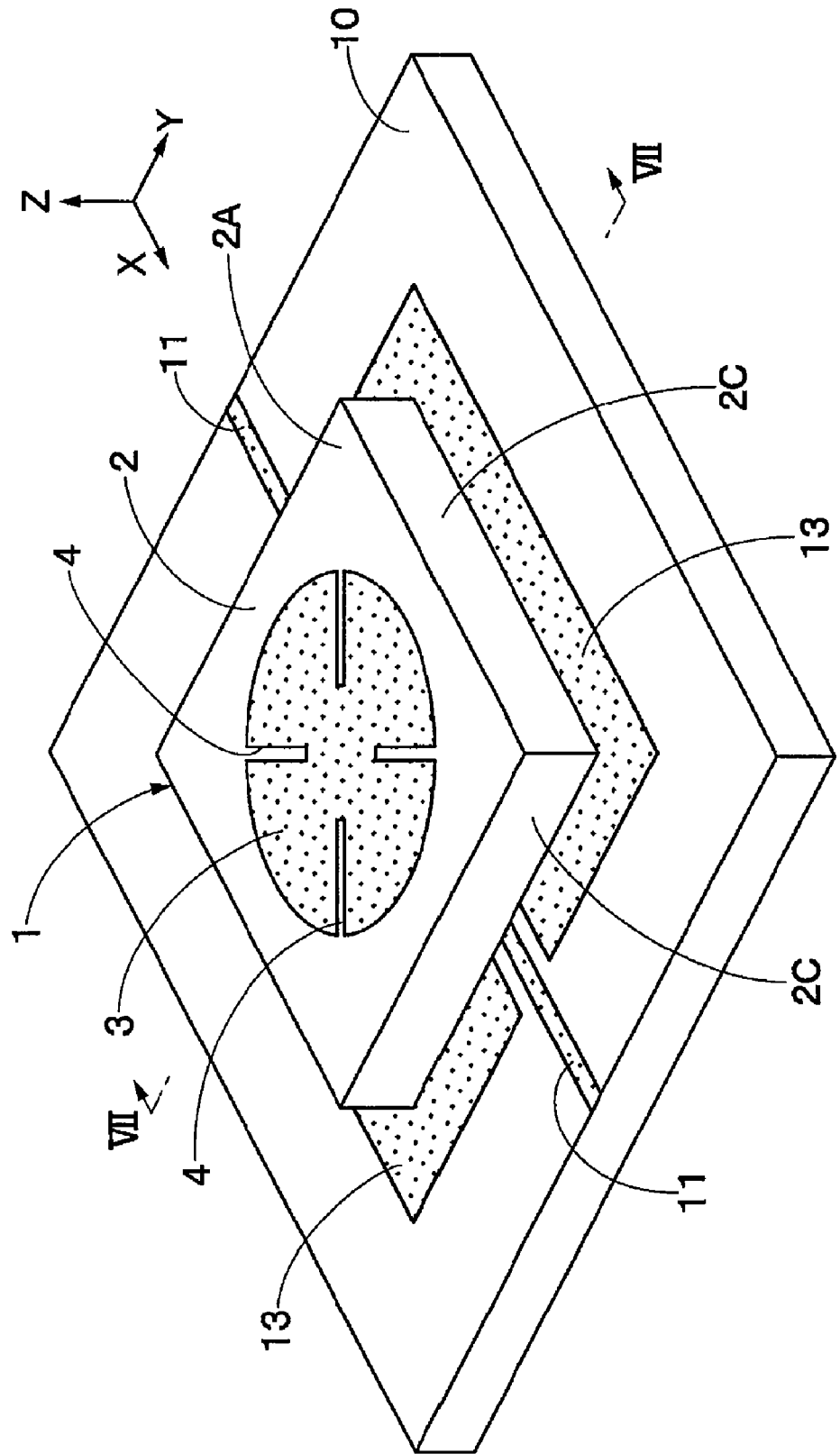
FIG. 1 is a perspective view showing a dielectric resonance apparatus according to a first embodiment of the present invention.

REFERENCE NUMERALS 1, 21, 43 TM010-mode resonator
2, 22, 44 dielectric substrate
3, 3', 23, 45 substantially circular electrode
5, 47 coupling line
7, 25, 25', 49 back-surface electrode
9, 50 gap
10 external substrate
11 signal line
13, 39 ground electrode
15, 53 bump
27, 27', 27'', 51 coupling electrode
28, 28', 28'', 52 open portion
31 oscillation circuit substrate (external substrate)
32 oscillation circuit unit
34, 41 micro-strip lines (signal line)
40 frequency control circuit unit
61 radar apparatus (transmission/reception apparatus)
62 oscillation apparatus

BEST MODE FOR CARRYING OUT THE INVENTION

A dielectric resonance apparatus, an oscillation apparatus, and a transmission/reception apparatus according to preferred embodiments of the present invention will be described in detail with reference to the accompanying drawings hereinafter.

Referring to FIGS. 1 to 8 which show a dielectric resonance apparatus according to a first embodiment, a TM010-mode resonator 1 includes a dielectric substrate 2, a substantially circular electrode 3, and a back-surface electrode 7, which will be described later.

The dielectric substrate 2 has a plate shape (a chip shape) and is made of a dielectric material. An example of the dielectric material used for the dielectric substrate 2 is a ceramic material having a relative dielectric constant $\in r1$ of approximately 26 (for example, $\in r=26$). The dielectric substrate 2 is a substantially square plate having sides of length L1 in the X direction (vertical direction) and Y direction (horizontal direction) and having a thickness T1 in the Z direction (thickness direction).

The substantially circular electrode 3 is disposed on a surface 2A of the dielectric substrate 2. The substantially circular electrode 3 is made of a thin film using a metal material, for example, and disposed in a center of the dielectric substrate 2. The substantially circular electrode 3 has a diameter of D which is defined in accordance with a resonance frequency of the dielectric substrate 2.

The substantially circular electrode 3 has four cutout portions 4 radially formed therein. The four cutout portions 4 are arranged with equal intervals in a circumferential direction and each of the four cutout portions 4 has a groove shape and extends along the radial direction and is used for setting the resonance frequency for other resonance modes (for example, a TM210 mode, and a TM310 mode).

A coupling line 5 is included in a magnetic-field coupling section. The coupling line 5 is arranged on a back surface 2B of the dielectric substrate 2 so as to face the substantially circular electrode 3 and extends toward an end portion (an end face 2C) of the dielectric substrate 2. The coupling line 5 linearly extends through the center axis O of the substantially circular electrode 3 and extends along the diameter of the substantially circular electrode 3. The coupling line 5 has a predetermined width W1. Furthermore, connection portions 6 having a width W2 which is larger than the width W1 are arranged at opposite ends of the coupling line 5 for facilitating the connection between the coupling line 5 and signal lines 11 which will be described later. Each of the connection portions 6 has a width of W2 and a length of L2, which is of a value equal to a value of the width of W2, so as to have a substantially square shape, for example, and is connected to one of the signal lines 11 disposed on an external substrate 10 which will be described later.

Two back-surface electrodes 7 are disposed on the back surface 2B of the dielectric substrate 2 and are disposed on either side of the coupling line 5 in the width direction of the coupling line 5. The two back-surface electrodes 7 cover the entire back surface 2B of the dielectric substrate 2 except for portions in the vicinity of the end face 2C of the dielectric substrate 2, and face the substantially circular electrode 3 with the dielectric substrate 2 interposed therebetween. A frame portion 8 (FIG. 6) having a width of δ0 is formed between the back-surface electrode 7 and the end face 2C of the dielectric substrate 2. The dielectric substrate 2 is exposed through the frame portion 8.

Gaps 9 are formed between the back-surface electrodes 7 and the coupling line 5. Each gap 9 linearly extends along the coupling line 5 and has a width of δ1. The gaps 9 function as an insulator arranged between the back-surface electrodes 7 and the coupling line 5. The width of the gap 9 is set to δ2 between the back-surface electrodes 7 and the connection portions 6.

Figure 2:
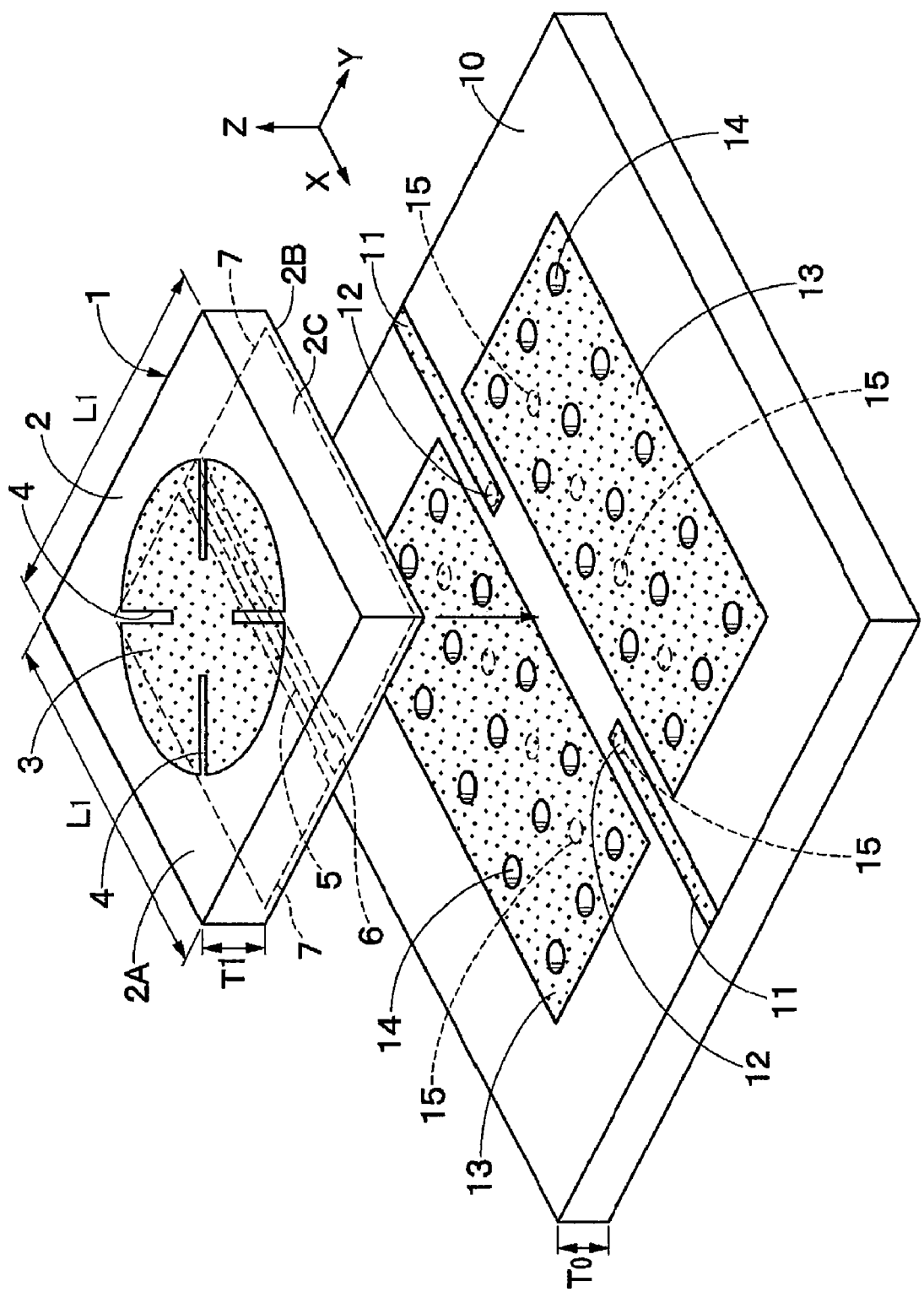
FIG. 2 is an exploded perspective view illustrating a TM010-mode resonator and an external substrate shown in FIG. 1.

The TM010-mode resonator 1 is implemented on an external substrate 10. Here, the external substrate 10 is made of a ceramic material or a resin material, for example, having a dielectric constant (for example, approximately ∈r=10) comparatively lower than that of the dielectric substrate 2, as which will be described later. As shown in FIGS. 1 and 2, the external substrate 10 has a plate shape having a predetermined thickness T0. The TM010-mode resonator 1 is disposed on a surface of the external substrate 10 such that the back surface 2B of the dielectric substrate 2 faces the surface of the external substrate 10. Furthermore, the signal lines 11 and ground electrodes 13, which will be described later, are disposed on the surface of the external substrate 10 at any portions other than the portions where the surface of the external substrate 10 faces the coupling line 5 of the TM010-mode resonator 1.

Two signal lines 11 are shown arranged on the surface of the external substrate 10. The signal lines 11 are arranged in positions different from positions where the TM010-mode resonator 1 faces the coupling line 5, and linearly extend along an imaginary line extending from the ends of the coupling line 5. Connection portions 12 are arranged at end portions of the signal lines 11 so as to face the connection portions 6 of the coupling line 5. The connection portions 12 of the signal lines 11 are superposed with the connection portions 6 of the coupling line 5 so that the TM010-mode resonator 1 and the external substrate 10 are connected with each other using bumps 15 which will be described later.

The two ground electrodes 13 shown are disposed on the surface of the external substrate 10 such that the ground electrodes 13 are insulated from the signal lines 11. The two ground electrodes 13 are separately arranged in the width direction of the TM010-mode resonator 1 with a portion on the external substrate 10 facing the coupling line 5 of the TM010-mode resonator 1 interposed therebetween. The ground electrodes 13 are connected to ground electrodes (not shown) formed on a back surface of the external substrate 10 through via holes 14. The ground electrodes 13 are connected to the back-surface electrodes 7 of the TM010-mode resonator 1 using the bumps 15.

The bumps 15 are used to connect the external substrate 10 and the TM010-mode resonator 1 with each other. Each of the bumps 15 has a substantially cylindrical shape having a diameter of φ and a height of h, and is used for connecting the connection portions 12 of the signal lines 11 and the connection portions 6 of the coupling line 5, and connecting the ground electrodes 13 and the back-surface electrodes 7. The bumps 15 are projected from the surface of the external substrate 10 and support the TM010-mode resonator 1.

The dielectric resonance apparatus according to the embodiment has the configuration as described above, and operation thereof will now be described.

Figure 3:
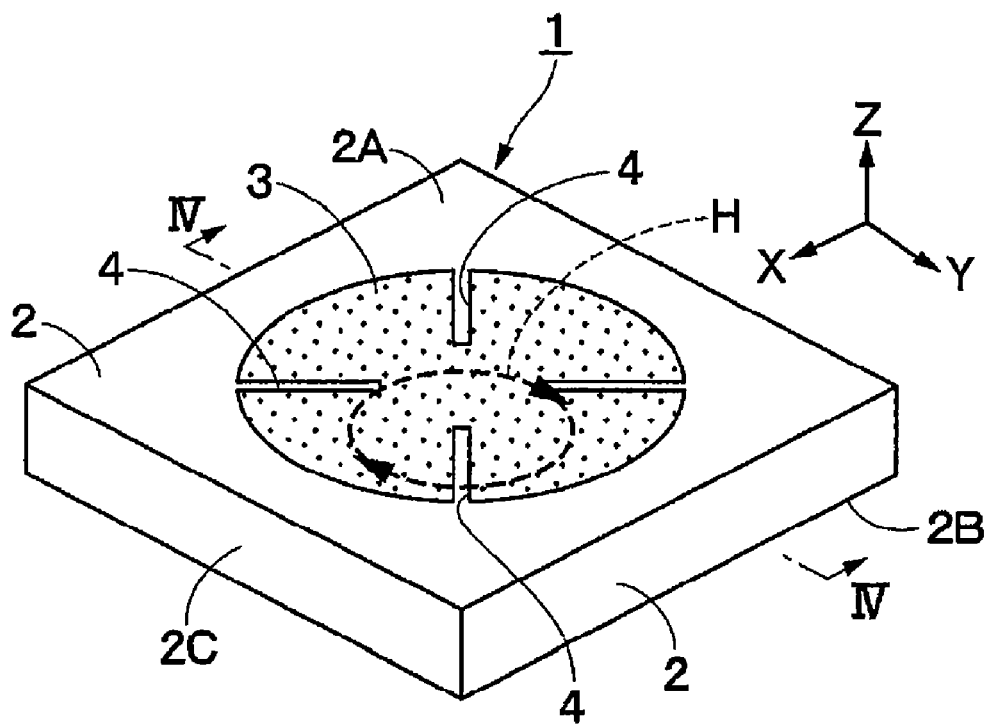
FIG. 3 is a perspective view illustrating the TM010-mode resonator alone shown in FIG. 1.
Figure 4:
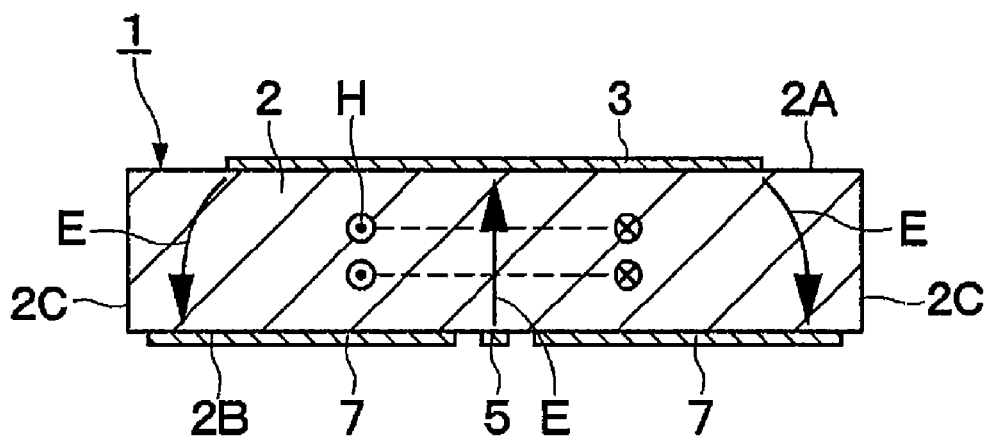
FIG. 4 is a sectional view of the TM010-mode resonator taking along a line IV-IV shown in FIG. 3 and viewed in a direction shown by arrows in FIG. 3.
Figure 5:
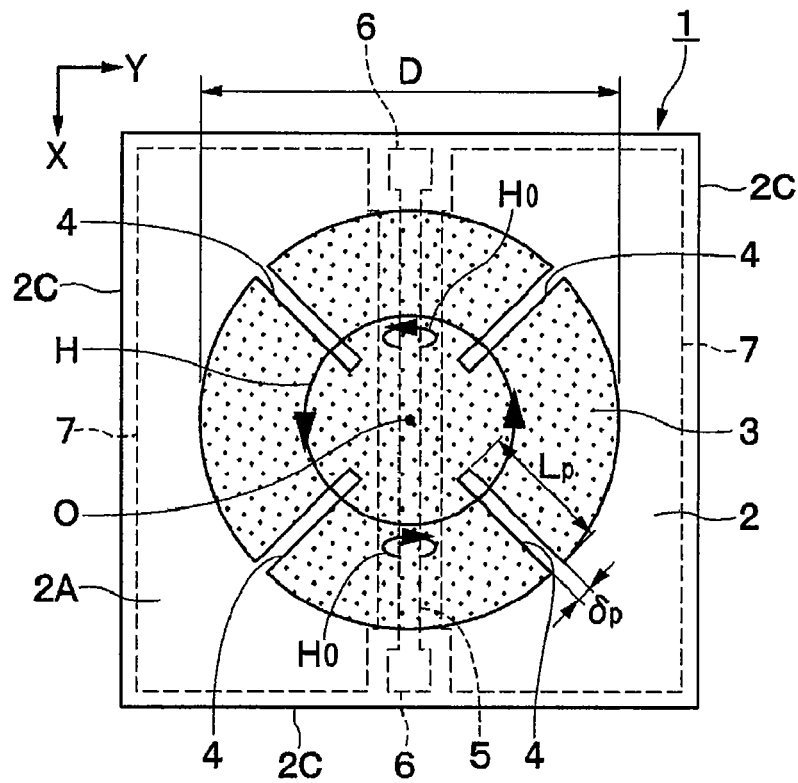
FIG. 5 is a plan view illustrating the TM010-mode resonator shown in FIG. 3.

When the TM010-mode resonator 1 is made to resonate, as shown in FIGS. 3 and 5, an electric field E is generated inside the dielectric substrate 2, that is, between the substantially circular electrode 3 and the back-surface electrodes 7 in the thickness direction of the dielectric substrate 2. Furthermore, a circular magnetic field H which concentrically rotates in the XY plane along the circumference of the substantially circular electrode 3 which is a concentric circle. The magnitude of the circular magnetic field H is small in the vicinity of the axis O of the substantially circular electrode 3 and in the vicinity of an outer circumference edge whereas the magnitude of the circular magnetic field H is large in an intermediate region (an intermediate region in a radial direction) between the axis O and the outer circumference edge.

When a high-frequency signal is supplied to the signal lines 11 of the external substrate 10, the high-frequency signal is supplied from the signal lines 11 to the coupling line 5 of the TM010-mode resonator 1, and thereby generates a magnetic field H0 which rotates around the coupling line 5 in the YZ plane.

When the frequency of the high-frequency signal is equal to a resonant frequency of the TM010-mode resonator 1, the rotation direction of the magnetic field H0 rotated in accordance with the high-frequency signal is inverted every half wavelength. Accordingly, a point at which a magnitude of the circular magnetic field H of the TM010-mode resonator 1 is large and a point at which a magnitude of the magnetic field H0 generated due to the high-frequency signal coincide with each other, and vector components in the Y direction of the circular magnetic field H and the magnetic field H0 match. Consequently, the TM010-mode resonator 1 is oscillated using the coupling line 5 since the coupling line 5 is magnetically coupled with the signal lines 11.

Figure 8:
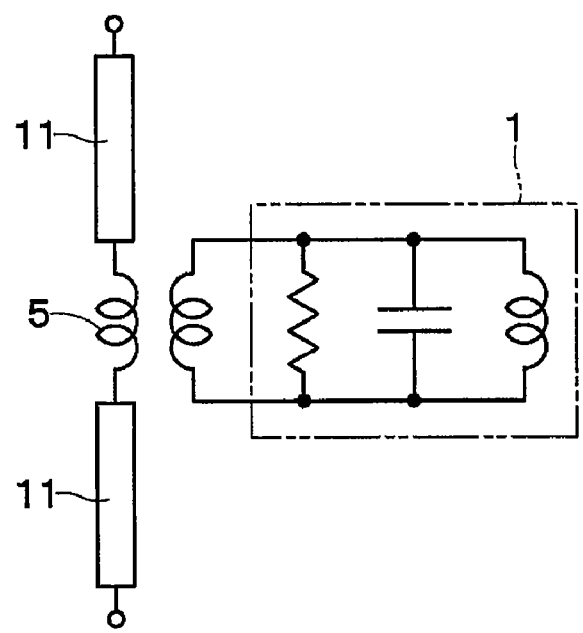
FIG. 8 is an equivalent circuit illustrating the dielectric resonance apparatus shown in FIG. 1.

The dielectric resonance apparatus according to the embodiment has an equivalent circuit illustrated in FIG. 8, and the coupling line 5 functions as a strip line and is magnetically coupled with the TM010-mode resonator 1. Accordingly, a reaction resonator may be formed by setting one end of the coupling line 5 as a terminal end. A reaction resonator employing the dielectric resonance apparatus according to this embodiment is analyzed in terms of a reflection characteristic using an electro-magnetic field simulation, and FIG. 9 shows the result of the analysis.

Figure 9:
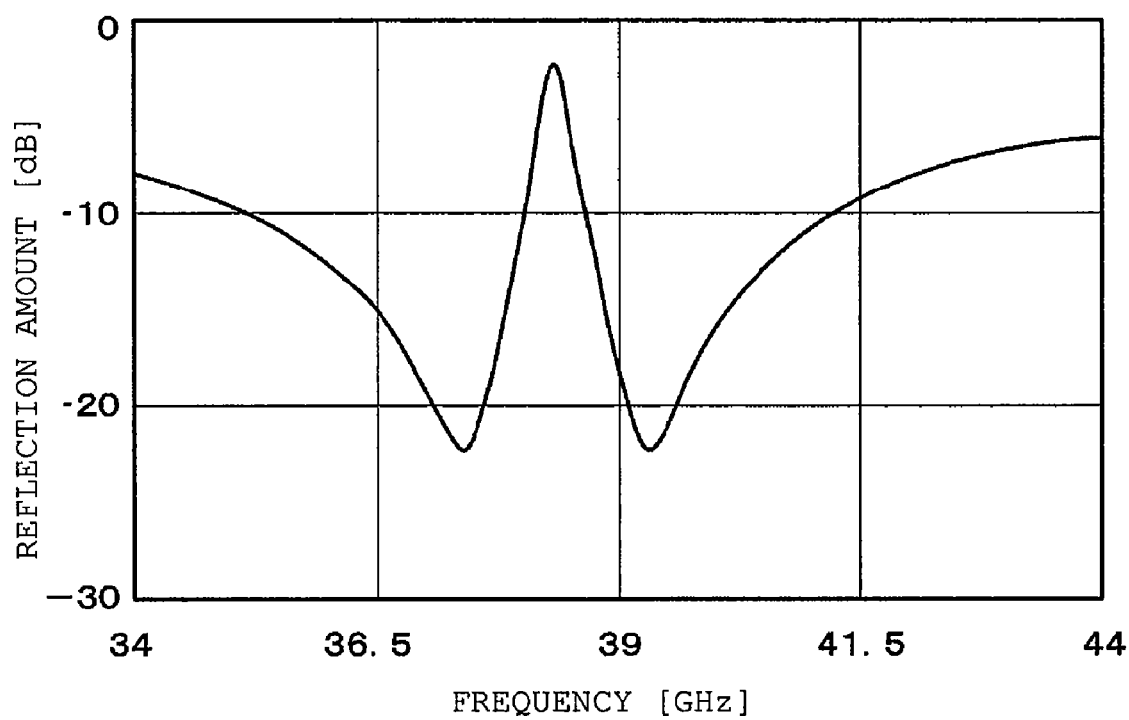
FIG. 9 is a diagram illustrating the relationship between the reflection amount and the frequency of the dielectric resonance apparatus according to the first embodiment.

Note that the result of the analysis shown in FIG. 9 is obtained when the one end of the coupling line 5 is set as a terminal end and the reflection amount with respect to a frequency characteristic of the TM010-mode resonator 1 viewed from the other end of the coupling line 5 is calculated. In this electromagnetic field simulation, the dielectric substrate 2 has a length L1 of 1.94 mm, a thickness T1 of 0.30 mm and a relative dielectric constant ∈r1 of 26. The substantially circular electrode 3 has a diameter D of 1.56 mm and each of the cutout portions 4 has a groove width δp of 0.04 mm, and a groove length Lp of 0.35 mm. Furthermore, the coupling line 5 has a width W1 of 0.08 mm, each of the connection portions 6 has a width W2 and a length L2 of 0.15 mm, the portion between the coupling line 5 and the back-surface electrodes 7 in the gap 9 has a width δ0 of 0.030 mm, the portion between the connection portions 6 and the back-surface electrodes 7 in the gap 9 has a width δ2 of 0.025 mm, and the frame portion 8 has a width δ0 of 0.05 mm. The external substrate 10 has a thickness T0 of 0.20 mm, a relative dielectric constant ∈r0 of 10 and a characteristic impedance Z0 of 50 Ω. Each of the bumps 15 has a diameter φ of 0.09 mm and a height h of 0.04 mm.

Referring to FIG. 9, it can be seen that the amount of reflection of the TM010-mode resonator 1 is large around the frequency band centered at 38 GHz, which is a resonant frequency whereas the amount of reflection of the TM010-mode resonator 1 is small in other frequency bands. Accordingly, a reaction resonator in which the amount of reflection thereof is large around the resonant frequency band of the TM010-mode resonator 1 may be configured utilizing the dielectric resonance apparatus according to this embodiment.

According to this embodiment, the magnetic field H0 generated in the coupling line 5 is made to coincide with the circular magnetic field H generated in the TM010-mode resonator 1 whereby the coupling line 5 is magnetically coupled with the TM010-mode resonator 1 since the coupling line 5 connected to the signal lines 11 is arranged on the back surface 2B of the dielectric substrate 2 of the TM010-mode resonator 1. Accordingly, the TM010-mode resonator 1 and the signal lines 11 are connected with each other using the coupling line 5, and the TM010-mode resonator 1 is excited by a high-frequency signal supplied to the signal lines 11.

Since the coupling line 5 serving as a magnetic-field coupling section is arranged on the back surface 2B of the dielectric substrate 2, the TM010-mode resonator 1 may be easily connected to the external substrate 10 through the bumps 15. Furthermore, since the coupling line 5 serving as a magnetic-field coupling section is arranged on the back surface 2B of the dielectric substrate 2 of the TM010-mode resonator 1, when compared with a case where a magnetic-field coupling section is arranged on the external substrate 10, the variation of the amount of coupling between the TM010-mode resonator 1 and the coupling line 5 may be reduced, and the electrical characteristic of the TM010-mode resonator 1 may be kept substantially constant. Since the coupling line 5 may be arranged in a position facing the substantially circular electrode 3, the TM010-mode resonator 1 may be made smaller compared to the case where the coupling line 5 is arranged in a position facing the outside of the substantially circular electrode 3.

Since the coupling line 5 arranged on the back surface 2B of the dielectric substrate 2 serves as a magnetic-field coupling section, the coupling line 5 may be formed simultaneously (together) with the back-surface electrodes 7 included in the TM010-mode resonator 1. Accordingly, the variation of an amount of coupling between the TM010-mode resonator 1 and the coupling line 5 may be reduced and the electrical characteristic of the TM010-mode resonator 1 may be kept constant. Furthermore, since the coupling line 5 is arranged in a position facing the substantially circular electrode 3, the TM010-mode resonator 1 may be made smaller compared to the case where the coupling line 5 is magnetically coupled with the TM010-mode resonator 1 in a position facing the outside of the substantially circular electrode 3.

In the TM010-mode resonator 1, the electrical characteristic of the TM010-mode resonator 1 is determined in accordance with the substantially circular electrode 3 and the back-surface electrodes 7 and the thickness T1 of the dielectric substrate 2, which constitute the TM010-mode resonator 1. Accordingly, a stable coupling characteristic may be easily obtained since the coupling line 5 is simultaneously formed with the back-surface electrodes 7. As a result, the fabrication cost may be reduced when compared with a case where a waveguide dielectric resonance apparatus (for which high-accuracy processing is difficult) is employed. Furthermore, since the coupling line 5 has a stable coupling characteristic with respect to the TM010-mode resonator 1, a frequency control circuit and the like need not be arranged on the dielectric substrate 2 of the TM010-mode resonator 1, but may be arranged on the external substrate 10. Since the frequency control circuit may be removed from the dielectric substrate 2, the TM010-mode resonator 1 may be miniaturized.

Note that, the coupling line 5, which is arranged at the position facing the substantially circular electrode 3 in this embodiment, serves as a magnetic-field coupling section, and the opposite ends thereof are connected to the signal lines 11 arranged on the external substrate 10. Therefore, the TM010-mode resonator 1 is in this configuration connected in parallel to a circuit arranged on the external substrate 10 having the signal lines 11 thereon. In this case, for example, the magnetic field H0 having a direction the same as that of the circular magnetic field H generated in the dielectric substrate 2 of the TM010-mode resonator 1 is generated around the coupling line 5 by supplying a high-frequency signal having a frequency serving as a resonant frequency to the coupling line 5. Therefore, the high-frequency signal supplied from one of the opposite ends of the coupling line 5 is reflected by the TM010-mode resonator 1 since the coupling line 5 and the TM010-mode resonator 1 are magnetically coupled with each other. Consequently, a reaction resonator is constituted and the degree of freedom of design of an oscillation apparatus, for example, is enhanced.

Figure 6:
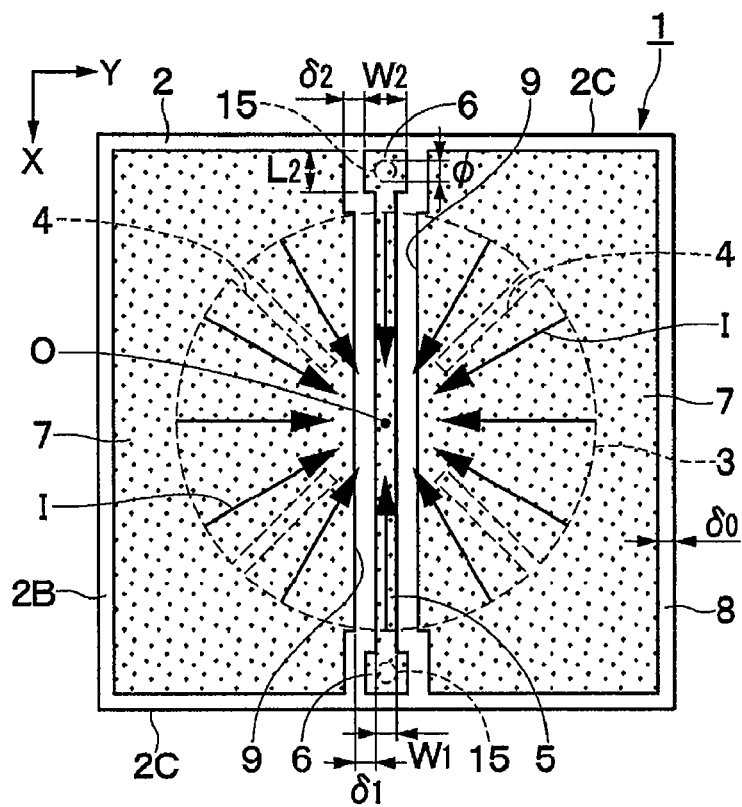
FIG. 6 is a bottom plan view illustrating the TM010-mode resonator shown in FIG. 3.
Figure 7:
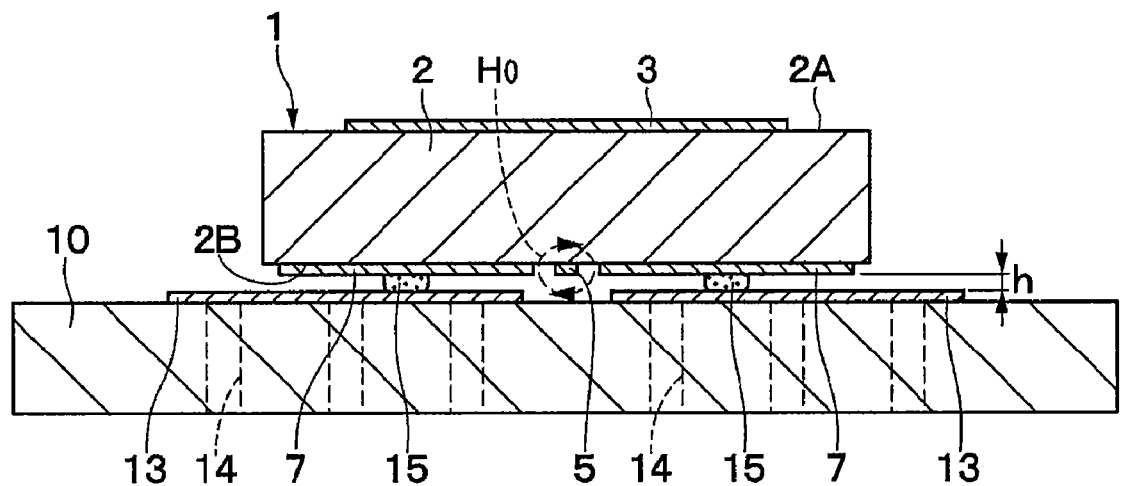
FIG. 7 is a sectional view of the TM010-mode resonator taking along a line VII-VII shown in FIG. 1 and viewed in a direction shown by arrows in FIG. 1.

Since the coupling line 5 passes through the axis O of the substantially circular electrode 3, a current loss due to existence of the coupling line 5 may be reduced when compared with a case where the coupling line 5 is arranged in another position. That is, a resonant current I is radially supplied toward the axis O of the substantially circular electrode 3 when the TM010-mode resonator 1 is made to resonate, as shown in FIG. 6. If a configuration in which the coupling line 5 is arranged so as to pass through a position other than the axis O of the substantially circular electrode 3 is employed, , the current loss of the TM010-mode resonator 1 is increased since the resonant current I is interrupted by the gaps 9 arranged so as to surround both sides of the coupling line 5. On the other hand, since the coupling line 5 is arranged so as to pass through the axis O of the substantially circular electrode 3 in this embodiment, the resonant current I is not interrupted by the gaps 9 and a current loss due to the existence of the coupling line 5 is reduced.

Since the signal lines 11 and the ground electrodes 13 are arranged in a region on the external substrate 10 not including the region on the external substrate 10 where the external substrate 10 faces the coupling line 5, the ground electrodes 13 on the external substrate 10 and the like are not arranged around the coupling line 5 when the TM010-mode resonator 1 is implemented on the external substrate 10. Accordingly, the magnetic field H0 generated around the coupling line 5 is not influenced by the ground electrodes 13 of the external substrate 10 even if a variation in the height h of the bumps 15 is generated when the coupling line 5 and the back-surface electrodes 7 on the TM010-mode resonator 1 are connected to the signal lines 11 and the ground electrodes 13 on the external substrate 10, respectively, using the bumps 15. Consequently, even if the variation of the heights h of the bumps 15 is generated, the amount of coupling between the TM010-mode resonator 1 and the coupling line is kept constant, that is, stable coupling is achieved.

Figure 10:
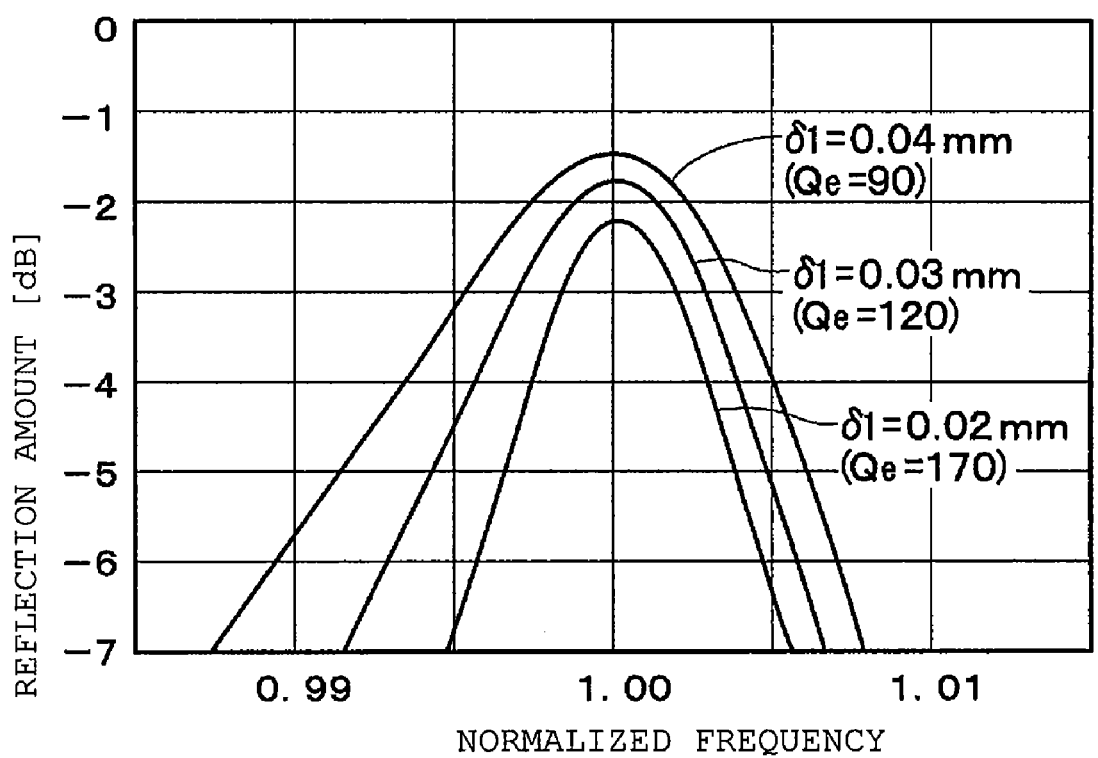
FIG. 10 is a diagram illustrating the relationships between the reflection amount and the normalized frequency of the dielectric resonance apparatus according to the first embodiment.

In this embodiment, since the gaps 9 are arranged in the width direction of the coupling line 5 so as to surround the coupling line 5, the magnetic field H0 generated around the coupling line 5 in accordance with the width δ1 of the gap 9 is changed, and the amount of coupling between the coupling line 5 and the TM010-mode resonator 1 is changed. Here, similarly to FIG. 9, the width δ1 of the gap 9 is set to various values, and a reaction resonator employing the dielectric resonance apparatus according to the embodiment is analyzed in terms of a reflection characteristic using a electromagnetic field simulation. FIG. 10 shows the result of the analysis.

In this electromagnetic field simulation, the various values of the width δ1 of the gaps 9 are 0.02 mm 0.03 mm, and 0.04 mm. Parameters other than the width δ1 of the gap 9 are set to the same values as those where the result shown in FIG. 9 is obtained. The axis of abscissa in FIG. 10 illustrates a normalized frequency, which is normalized using a resonant frequency.

As is apparent from the result of the analysis shown in FIG. 10, when the width δ1 of the gap 9 is small, the amount of reflection of the TM010-mode resonator 1 is small whereas when the width δ1 of the gap 9 becomes large, the amount of reflection of the TM010-mode resonator 1 is large. This is because as the width δ1 of the gaps 9 is larger, the magnetic field H0 generated in the dielectric substrate 2 is expanded in the Y direction, and the Q factor (Qe) for the coupling with the TM010-mode resonator 1 becomes smaller to enhance the coupling.

As described above, the magnetic field H0 generated around the coupling line 5 is expanded and therefore the amount of coupling is increased by setting the value of the width δ1 of the gaps 9 larger, whereas the magnetic field H0 generated around the coupling line 5 is reduced and therefore an amount of coupling is reduced by setting the value of the width δ1 of the gaps 9 smaller. Accordingly, the amount of coupling between the coupling line 5 and the TM010-mode resonator 1 may be controlled to a desired value. The degree of freedom of design is enhanced.

In the first embodiment, the amount of coupling between the coupling line 5 and the TM010-mode resonator 1 is set to a desired value in accordance with the width δ1 of the gap 9. However, the amount of coupling between the coupling line 5 and the TM010-mode resonator 1 may be set to the desired value in accordance with the width W1 of the coupling line 5. In this case, the magnetic field generated around the coupling line 5 is expanded and therefore the amount of coupling is increased by setting a value of the width W1 of the coupling line 5 larger, whereas the magnetic field generated around the coupling line 5 is reduced and therefore the amount of coupling is reduced by setting the value of the width W1 of the coupling line 5 smaller.

Figure 11:
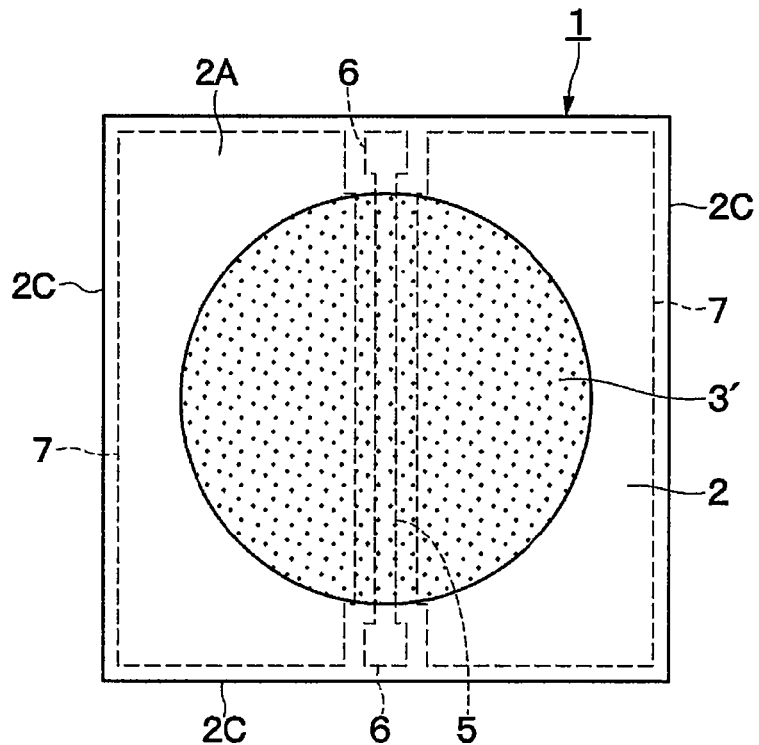
FIG. 11 is a plan view illustrating a TM010-mode resonator according to a first modification.

In the first embodiment, the four cutout portions 4 are arranged on the substantially circular electrode 3 for controlling the resonant frequency for other resonance modes. However, as illustrated as a first modification in FIG. 11, a substantially circular electrode 3' without cutout portions may be employed. The shape of the substantially circular electrode 3 is not limited to the circular shape but may be an oval shape.

Figure 12:
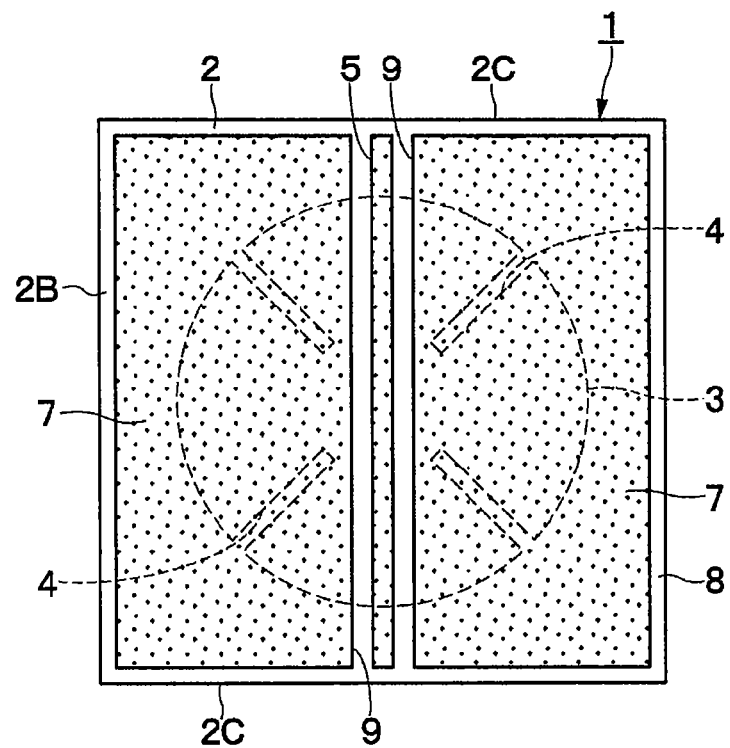
FIG. 12 is a bottom plan view illustrating a TM010-mode resonator according to a second modification.

In the first embodiment, the connection portions 6, each of which has a large width, are arranged on either side of the coupling line 5. However, as shown in a second modification shown in FIG. 12, the connection portions may be eliminated and the coupling line 5 may be extended.

In the first embodiment, each of the two back-surface electrodes 7 has a square shape and the back-surface electrodes 7 cover the entire back surface 2B of the dielectric substrate 2. However, the present invention is not limited to this and each of the back-surface electrodes may have a circular shape or an oval shape, for example.

In the first embodiment, the coupling line 5 of the TM010-mode resonator 1 and the signal lines 11 of the external substrate 10 are directly connected. However, the present invention is not limited to this. The coupling line 5 and the signal lines 11 may be connected through a matching circuit. In this case, the matching circuit may be arranged on one of the dielectric substrate 2 and the external substrate 10, or may be arranged on both of the dielectric substrate 2 and the external substrate 10.

Figure 13:
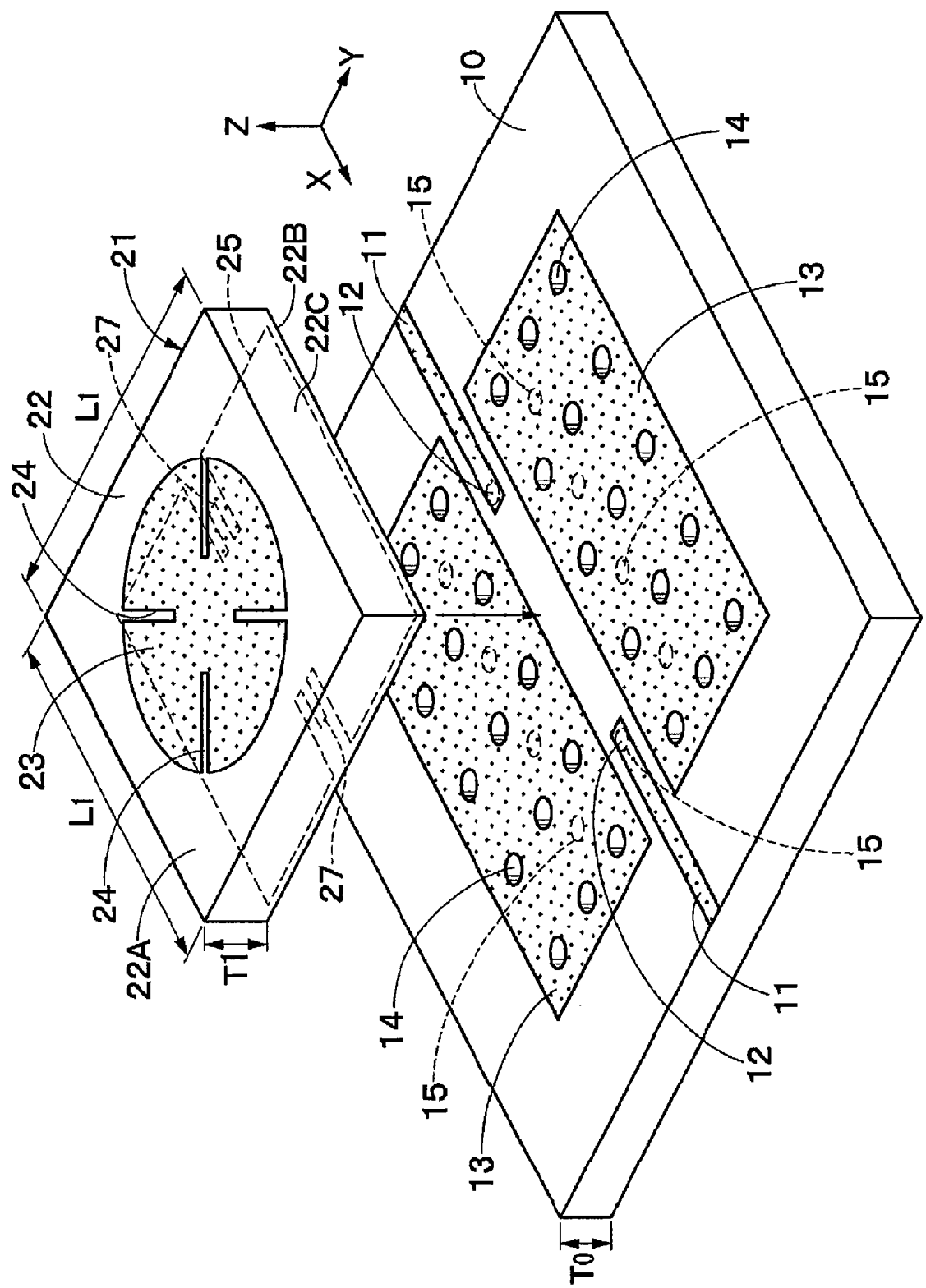
FIG. 13 is an exploded perspective view illustrating a TM010-mode resonator and an external substrate of a dielectric resonance apparatus according to a second embodiment.
Figure 14:
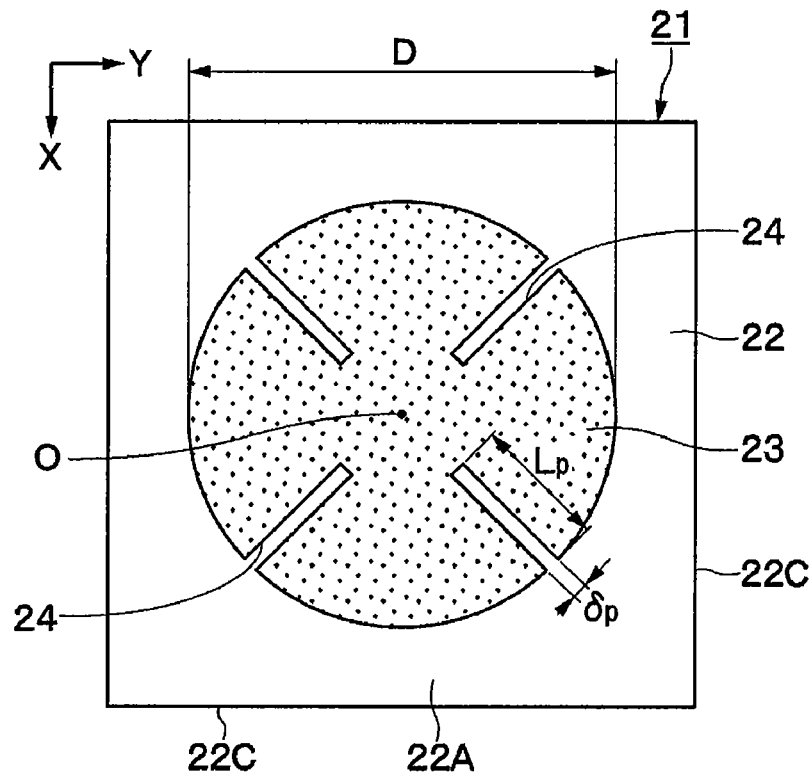
FIG. 14 is a plan view illustrating the TM010-mode resonator shown in FIG. 13.
Figure 15:
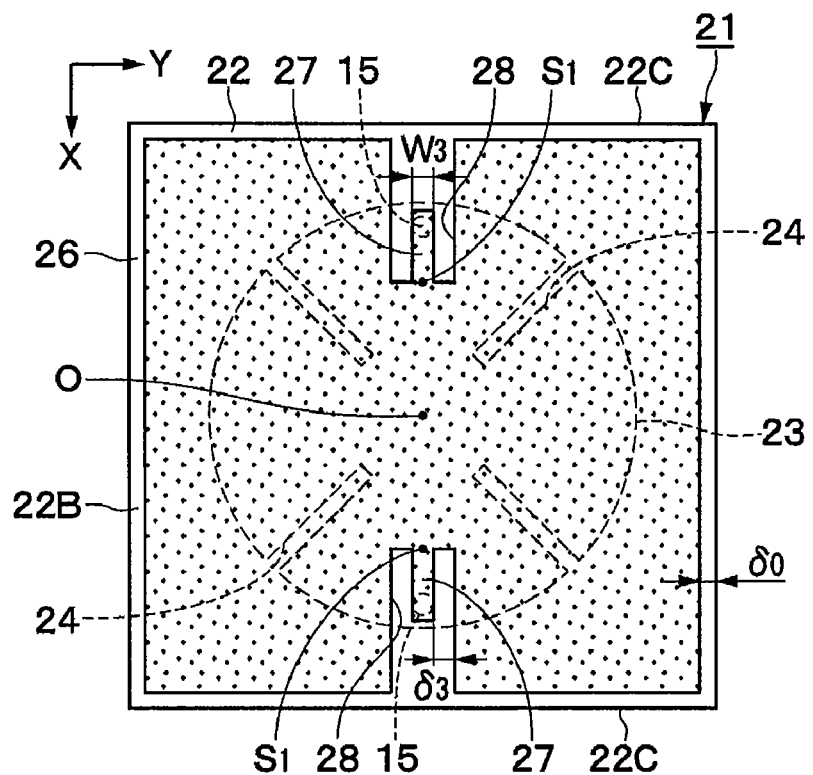
FIG. 15 is a bottom plan view illustrating the TM010-mode resonator shown in FIG. 13.

FIGS. 13 to 15 shows a dielectric resonance apparatus according to a second embodiment of the present invention. According to the second embodiment, a back-surface electrode which covers a substantially circular electrode is arranged on a back surface of a dielectric substrate of a TM010-mode resonator, coupling electrodes, which have short-circuit points each arranged between ends of an open portion arranged on the back-surface electrode, serve as magnetic-field coupling sections, and each of the coupling electrodes and a corresponding one of signal lines on an external substrate are connected at one point. In this embodiment, the same reference numerals are used for components having the same functions as those described in the first embodiment, and the descriptions thereof are omitted.

A TM010-mode resonator 21 includes a dielectric substrate 22, a substantially circular electrode 23, and a back-surface electrode 25, which are similar to the dielectric substrate of the TM010-mode resonator 1 described in the first embodiment.

The dielectric substrate 22 has a plate-like shape and is made of a dielectric material having a relative dielectric constant $\in r1$. The dielectric substrate 22 is a substantially square plate having sides of length L1 in the X direction (vertical direction) and Y direction (horizontal direction) and having a thickness T1 in the Z direction (thickness direction).

The substantially circular electrode 23 is disposed on a surface 22A of the dielectric substrate 22. The substantially circular electrode 23 is made of a dielectric thin film, for example, and disposed in a center of the dielectric substrate 22. The substantially circular electrode 23 has a diameter D which is defined in accordance with a resonance frequency of the dielectric substrate 22. Four cutout portions 24 are radially arranged in the substantially circular electrode 23 similarly to the substantially circular electrode 3 of the first embodiment.

The back-surface electrode 25 is arranged on a back surface 22B of the dielectric substrate 22. The back-surface electrode 25 covers the entire back surface 22B of the dielectric substrate 22 except for portions in the vicinities of end faces 22C of the dielectric substrate 22, and faces the substantially circular electrode 23 with the dielectric substrate 22 interposed therebetween. A frame portion 26 having a width of δ0 is formed between the back-surface electrode 25 and the end faces 22C of the dielectric substrate 22. The dielectric substrate 22 is exposed through the frame portion 26. The back-surface electrode 25 is connected to the ground electrodes 13 of the external substrate 10.

Two coupling electrodes 27 serve as magnetic-field coupling sections. The two coupling electrodes 27 are arranged on either side of the back-surface electrode 25 in the X direction so as to face the substantially circular electrode 23. The coupling electrodes 27 are surrounded by open portions (cutout portions) 28, which are arranged at end portions of the back-surface electrode 25 and each of which has a U-shape, so as to have a band-like shape (tongue-like shape) having a predetermined width W3. The coupling electrodes 27 extend in the radial direction of the substantially circular electrode 23 from the center of the back-surface electrode 25 to the end portion. A tip of each of the coupling electrodes 27 is surrounded by a corresponding one of the open portions 28 (cutout portions), which are arranged at the end portions of the back-surface electrode 25 and each of which has a U-shape, so as to be an open end. Base ends of the coupling electrodes 27 are connected to the back-surface electrode 25 and serve as short-circuit points S1. The tips (open ends) of the coupling electrodes 27 are connected to the signal lines 11 of the external substrate 10 using the bumps 15.

Each of the short-circuit points S1 is arranged in the vicinity of a position having a large magnitude magnetic field of the TM010-mode resonator 21, that is, a position where each of the short-circuit points S1 is strongly coupled with the TM010-mode resonator 21. Therefore, the short-circuit points S1 are arranged around intermediate portions (intermediate portions in the radial direction) between the axis O and an outer circumference edge of the substantially circular electrode 23. Each of the open portions 28 has portions between which a corresponding one of the coupling electrodes 27 is interposed and each of the portions has a predetermined gap width δ3. The portions of the open portions 28 sandwich each of the short-circuit points S1 in the width direction of the open portions 28.

The dielectric resonance apparatus according to this embodiment has the configuration described above, and the operation thereof will now be described.

When high-frequency signals are supplied to the signal lines 11 of the external substrate 10, high-frequency signals are supplied through the coupling electrodes 27 of the TM010-mode resonator 21 from the signal lines 11 and magnetic fields, each of which rotates within a YZ plane around a corresponding one of the coupling electrodes 27 as a center, are generated.

When the frequencies of the high-frequency signals are the same as a resonance frequency of the TM010-mode resonator 21, magnitudes of the magnetic fields become large at the short-circuit points Sl and become small in the vicinity of the outer circumference edge of the substantially circular electrode 23. Consequently, the position where the magnitude of the magnetic field of the TM010-mode resonator 21 itself is large and the position where the magnitude of the magnetic field of the TM010-mode resonator 21 is large due to the high-frequency signals coincide with each other, and the position where the magnitude of the magnetic field of the TM010-mode resonator 21 itself is small and the position where the magnitude of the magnetic field of the TM010-mode resonator 21 is small due to the high-frequency signal coincide with each other. Furthermore, vector components of the two magnetic fields coincide with each other around the short-circuit points S1. Consequently, since the coupling line 5 is magnetically coupled with the signal lines 11, the TM010-mode resonator 21 is excited using the coupling electrodes 27.

Figure 16:
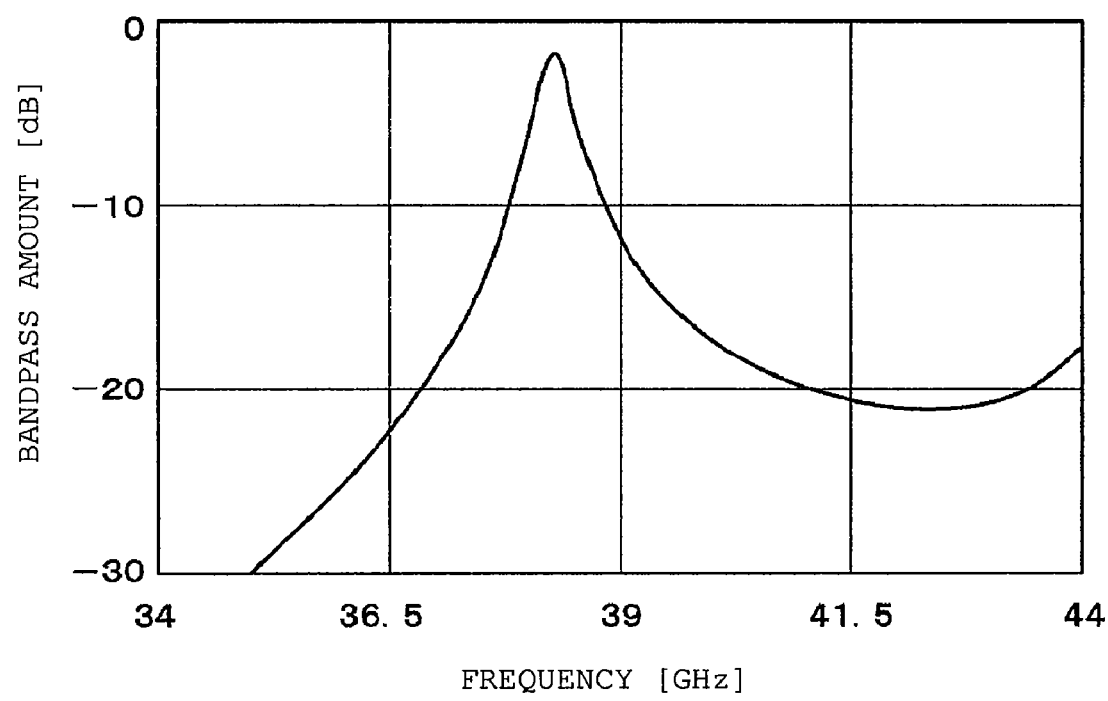
FIG. 16 is a diagram illustrating a characteristic line which shows the relationship between a bandpass amount and a frequency of the dielectric resonance apparatus according to the second embodiment.

Accordingly, a bandpass resonator is formed between the two coupling electrodes 27 since the coupling electrodes 27 are magnetically connected to the TM010-mode resonator 2. The bandpass characteristic of the dielectric resonance apparatus according to this embodiment is analyzed by an electromagnetic field simulation. FIG. 16 shows a result of the analysis.

In the electromagnetic field simulation, the dielectric substrate 22 has a length L1 of 1.94 mm, a thickness T1 of 0.30 mm and a relative dielectric constant ∈r1 of 26. The substantially circular electrode 23 has a diameter D of 1.56 mm, and each of the cutout portions 24 has a groove width δp of 0.04 mm and a groove length Lp of 0.35 mm. Furthermore, each of the coupling electrodes 27 has a width W1 of 0.15 mm, each of the portions of each of the open portions 28, the portions sandwiching the corresponding short-circuit point S1, has a gap width δ3 of 0.075 mm, and the frame portion 8 has a width δ0 of 0.05 mm. The external substrate 10 has a thickness T0 of 0.20 mm, a relative dielectric constant ∈r0 of 10, and a characteristic impedance Z0 of 50 Ω. Each of the bumps 15 has a diameter φ of 0.09 mm and a height h of 0.04 mm.

Referring to FIG. 16, it can be seen that the bandpass amount of the TM010-mode resonator 21 is large around a frequency band centered at 38 GHz, which is a resonant frequency, whereas the bandpass amount of the TM010-mode resonator 1 is small in other frequency bands. Accordingly, a reaction resonator, in which the bandpass amount thereof is large around the resonant frequency band of the TM010-mode resonator 21, may be configured utilizing the dielectric resonance apparatus according to this embodiment.

Accordingly, an operation effect similar to that of the first embodiment is obtained in this embodiment. Particularly, the coupling electrodes 27 having the short-circuit points S1 sandwiched by the open portions 28 arranged on the substantially circular electrode 23 serve as magnetic-field coupling portions, and the ends (tips) of the coupling electrodes 27 are connected to the signal lines 11 of the external substrate 10 in this embodiment. Accordingly, the TM010-mode resonator 21 is connected in series to circuits arranged on a surface of the external substrate 10 on which the signal lines 11 are arranged. With this configuration, a TM010-mode resonator 21 including the two coupling electrodes 27 functions as a bandpass resonator, and accordingly, is configured as a bandpass resonator. Consequently, the TM010-mode resonator 21 allows a high-frequency signal supplied to one of the coupling electrodes 27 from the signal lines 11 of the external substrate 10 to pass at the resonant frequency of the TM010-mode resonator 21 and reflects the high-frequency signal at other frequencies.

In this embodiment, the tips of the coupling electrodes 27 are surrounded by the U-shaped open portions 28 and connected to the signal lines 11 of the external substrate 10, and the base ends of the coupling electrodes 27 are connected to the back-surface electrode 25 and serve as the short-circuit points S1. Accordingly, the tips of the coupling electrodes 27, which are open ends, allow high-frequency signals to be supplied, and magnetic fields having large magnitudes are generated around the base ends of the coupling electrodes 27 serving as the short-circuit points S1 so that the coupling electrodes 27 and the TM010-mode resonator 21 are magnetically coupled with each other.

Figure 17:
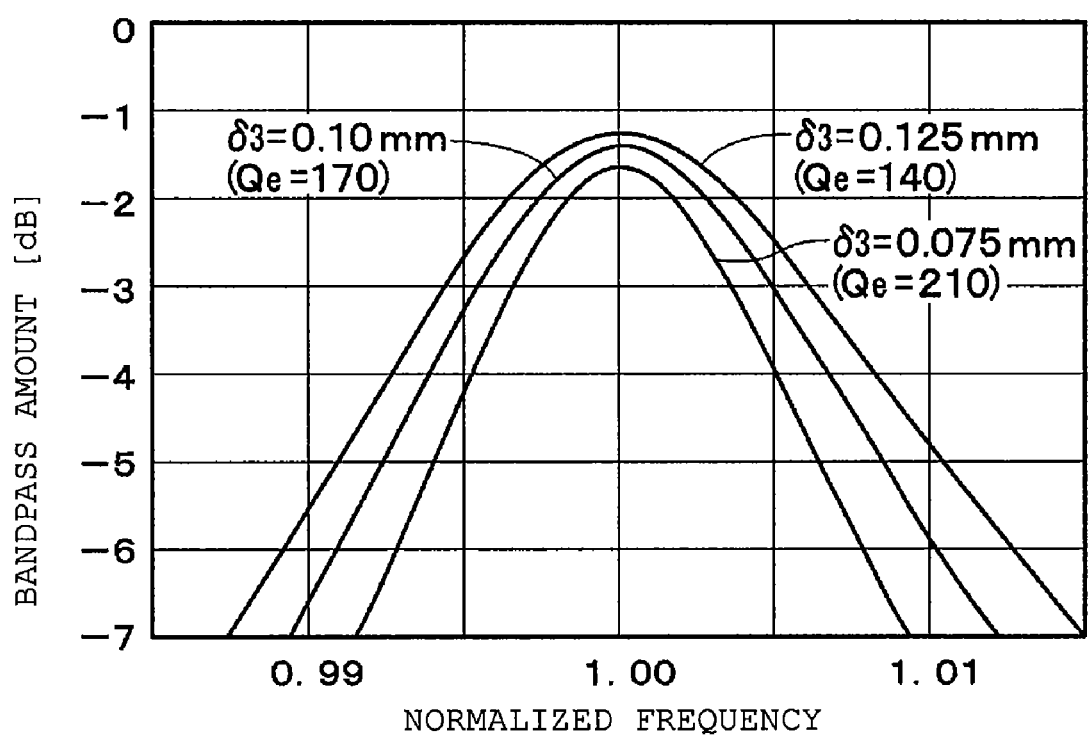
FIG. 17 is a diagram illustrating the relationships between the bandpass amount and the normalized frequency of the dielectric resonance apparatus according to the second embodiment.

Since the short-circuit points S1 included in the coupling electrodes 27 are sandwiched by the portions of the open portions 28 in the width direction in this embodiment, the magnetic fields H0 generated around the short-circuit points S1 in accordance with the width δ3 of portions of the open portions 28 located in the vicinity of the short-circuit points S1 change, and the amount of coupling between the coupling electrodes 27 and the TM010-mode resonator 21 changes. Here, the bandpass characteristic in a bandpass resonator employing the dielectric resonance apparatus according to this embodiment, in which the gap width δ3 included in each of the open portions 28 is set to various values is analyzed using a electromagnetic field simulation similarly to FIG. 16. FIG. 17 shows a result of the analysis.

In this electromagnetic field simulation, the calculation is performed under conditions where the gap width δ3 included in each of the open portions 28 is set to 0.075 mm, 0.10, and 0.125 mm. Parameters other than the gap width δ3 included in each of the open portions 28 are set to the same values as obtained in the result of the analysis shown in FIG. 16. On FIG. 17, the axis of abscissa represents a normalized frequency normalized by a resonant frequency.

As can be seen from the result of analysis shown in FIG. 17, when the gap width δ3 included in each of the open portions 28 is small, the bandpass amount of the TM010-mode resonator 21 is small, whereas when the gap width δ3 included in each of the open portions 28 is large, the bandpass amount of the TM010-mode resonator 21 is large. This is because as the gap width δ3 included in each of the open portions 28 becomes large, the magnetic field generated in the dielectric substrate 22 expands in the Y direction and the Q factor (Qe) for the coupling with the TM010-mode resonator 21 becomes smaller to enhance the coupling.

As described above, the magnetic field generated around the short-circuit points S1 is expanded and therefore the amount of coupling is increased by setting the value of the gap width δ3 included in each of the open portions 28 larger, whereas the magnetic field generated around the short-circuit points S1 is reduced and therefore the amount of coupling is reduced by setting the value of the gap width δ3 included in each of the open portions 28 smaller. Accordingly, the amount of coupling between the coupling electrodes 27 and the TM010-mode resonator 21 may be controlled to a desired value. The degree of freedom of design is enhanced.

Figure 18:
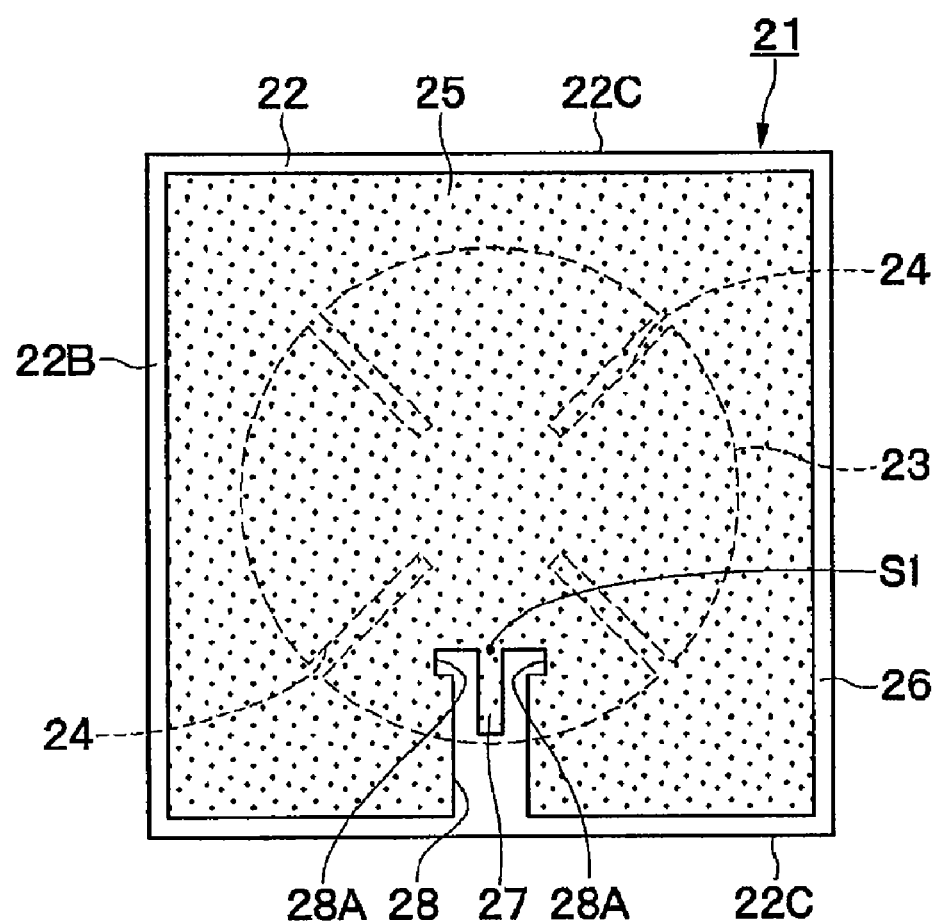
FIG. 18 is a bottom plan view illustrating a TM010-mode resonator according to a third modification.

In the second embodiment, the gap widths δ3 included in the open portions 28 are uniform in all of the coupling electrodes 27. However, the present invention is not limited to this, and as a third modification shown in FIG. 18, the gap width of the open portions 28 may be designed so as to be large only around the short-circuit points S1, and therefore, large-width portions 28A may be designed at tips of the open portions 28. In this case, an amount of coupling is set in accordance with the gap width of each of the large-width portions.

In the second embodiment, the amount of coupling between the coupling electrodes 27 and the TM010-mode resonator 21 is set to a desired amount in accordance with the gap width δ3 included in each of the open portions 28. However, the present invention is not limited to this. The amount of coupling between the coupling electrodes 27 and the TM010-mode resonator 21 may be set to a desired amount in accordance with the distance between a portion in which a magnitude of the magnetic field of the TM010-mode resonator 21 is large (for example, an intermediate portion between the axis O of the substantially circular electrode 23 and the outer circumference edge) and the short-circuit points S1 of the coupling electrodes 27. In this case, the amount of coupling is increased by changing the position of the short-circuit points Si so as to be close to the position where the magnitude of the magnetic field generated in the TM010-mode resonator 21 is large, whereas the amount of coupling is reduced by changing the position of the short-circuit points S1 so as to be far away from the position where a magnitude of the magnetic field generated in the TM010-mode resonator 21 is large. Accordingly, the amount of coupling with the TM010-mode resonator may be controlled to be a desired amount in accordance with the position of the short-circuit points S1. Hence, the degree of freedom of design is enhanced.

Figure 19:
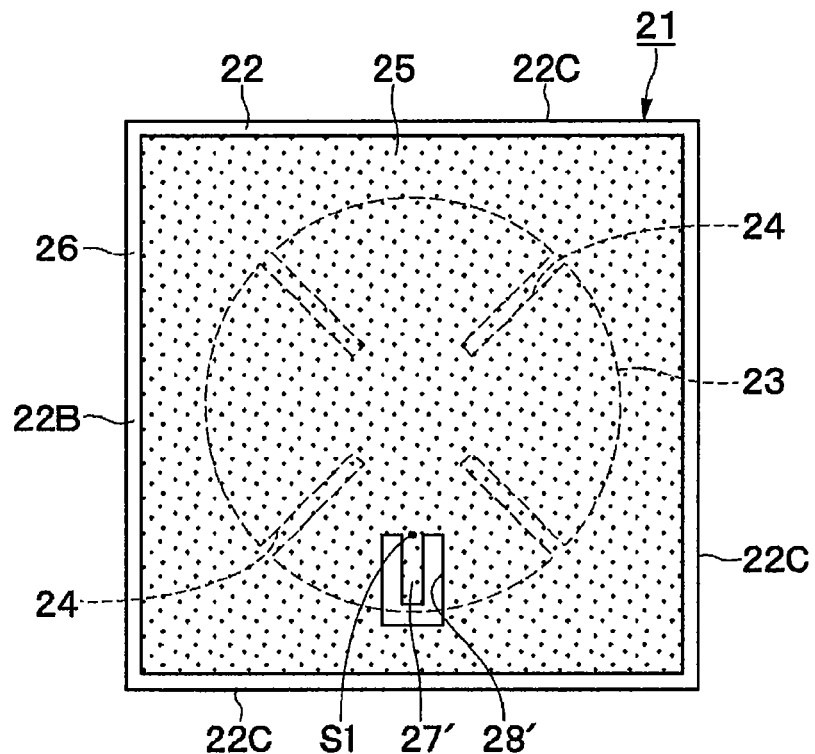
FIG. 19 is a bottom plan view illustrating a TM010-mode resonator according to a fourth modification.

In the second embodiment, the open portions 28 are configured as cutout portions extending from end portions toward the center of the back-surface electrode 25. However, the open portions 28 are not necessarily arranged in the end portions of the back-surface electrode 25, and open portions 28' may be arranged in positions nearer to the center of the back-surface electrode 25 as shown in a fourth modification illustrated in FIG. 19, to thereby form coupling electrodes 27', and therefore, the open portions 28' may be surrounded by the back-surface electrode 25.

Figure 20:
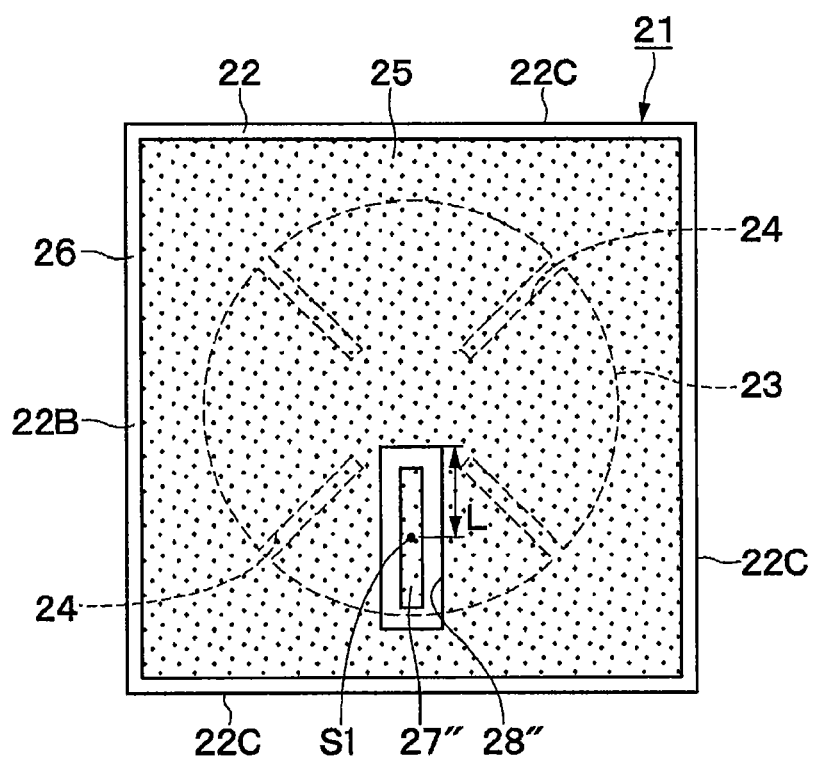
FIG. 20 is a bottom plan view illustrating a TM010-mode resonator according to a fifth modification.

In the second embodiment, each of which has a base end which serves as one of the short-circuit points S1 and which is connected to the back-surface electrode 25 and the tip which is an open end, are constituted since the U-shaped open portions 28 are arranged on the back-surface electrode 25, the coupling electrodes 27. However, the present invention is not limited to this. As a fifth modification shown in FIG. 20, an open portion 28" having a rectangular frame shape may be arranged on the back-surface electrode 25, and therefore, a coupling electrode 27" which has both ends as open ends in the longitudinal direction and which has a virtual short-circuit point S1 in an intermediate portion thereof in the longitudinal direction may be constituted. In this case, the distance L between the short-circuit point S1 and the back-surface electrode 25 in the longitudinal direction is set to a value of approximately λg/4 (L≈λg/4) with respect to a wavelength λg of a resonant frequency of the dielectric substrate 22.

Figure 21:
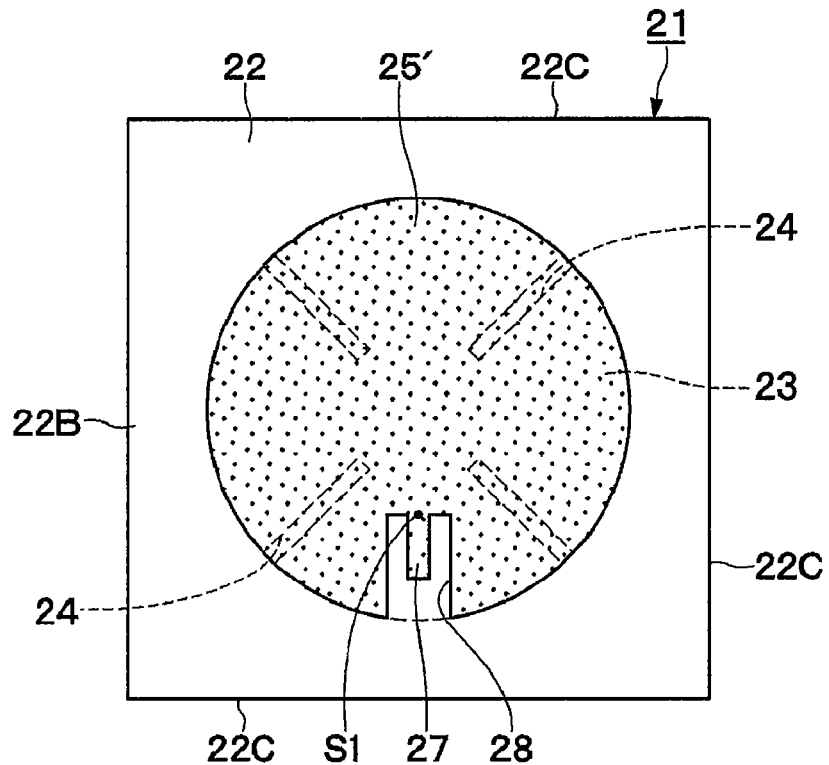
FIG. 21 is a bottom plan view illustrating a TM010-mode resonator according to a sixth modification.

In the second embodiment, the back-surface electrode 25 is arranged to have a rectangular shape so as to entirely cover the back surface 22B of the dielectric substrate 22. However, the present invention is not limited to this, and a back-surface electrode 25' may be arranged, as a sixth modification shown in FIG. 21, so as to have a circular shape, an oval shape or any other shape.

Figure 22:
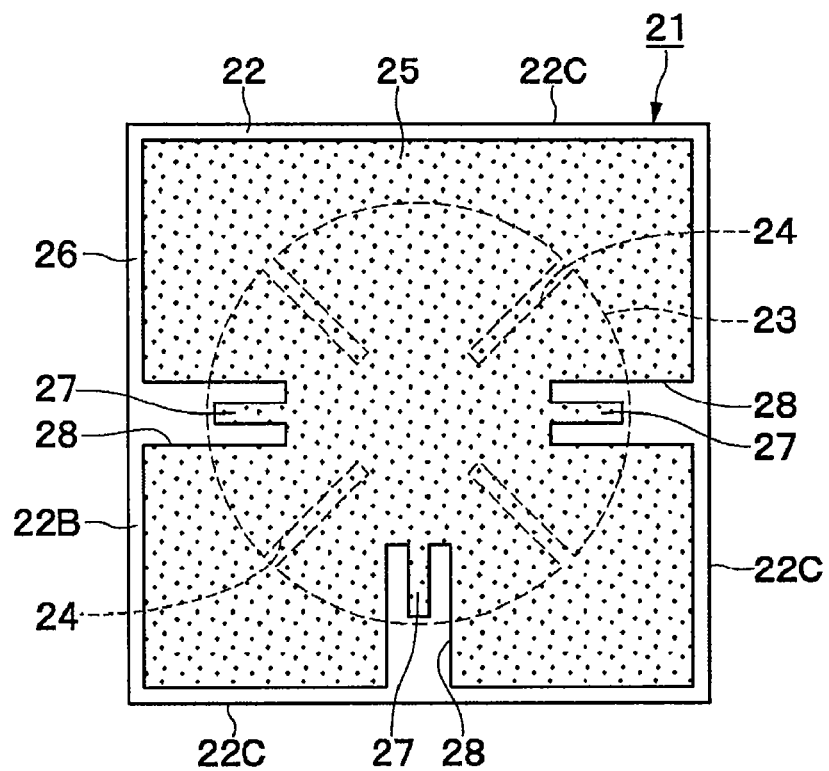
FIG. 22 is a bottom plan view illustrating a TM010-mode resonator according to a seventh modification.
Figure 23:
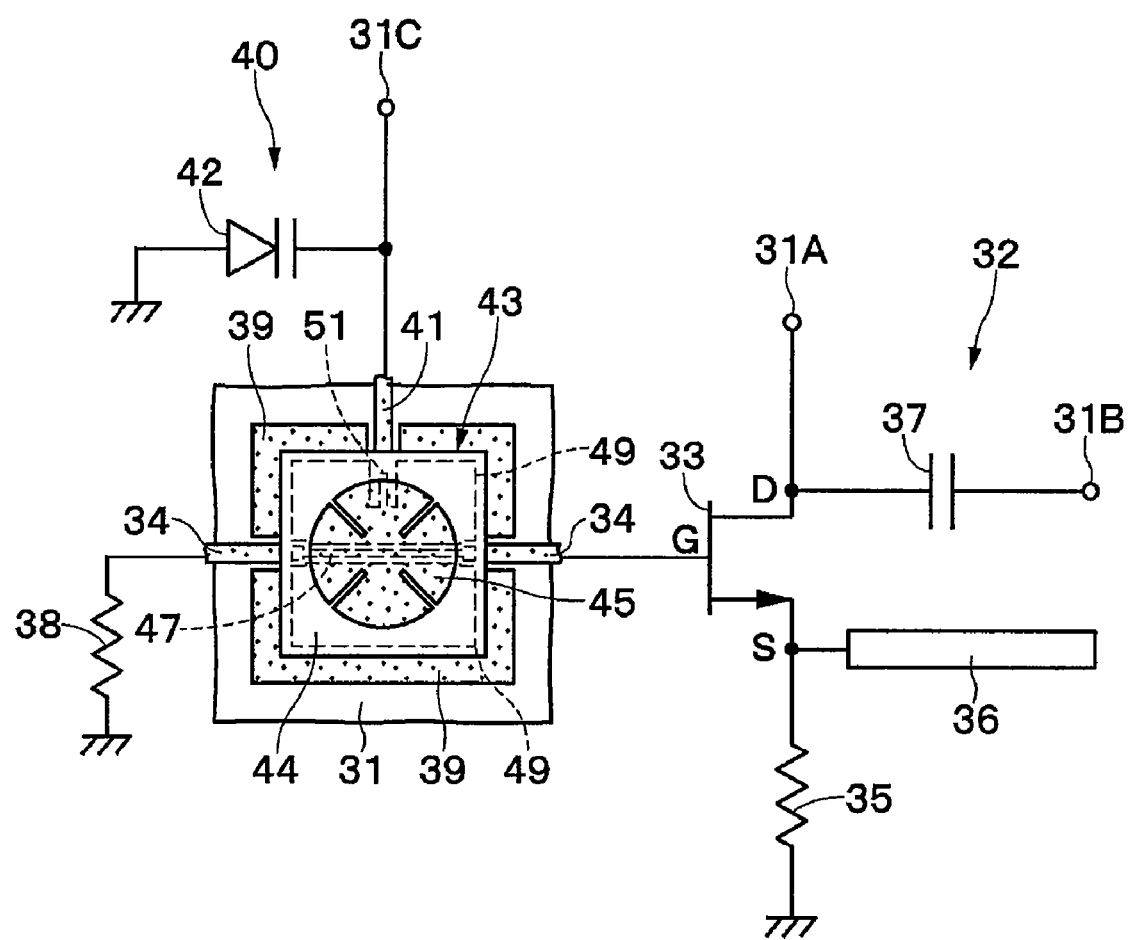
FIG. 23 is a circuit diagram illustrating an oscillation apparatus according to a third embodiment.
Figure 24:
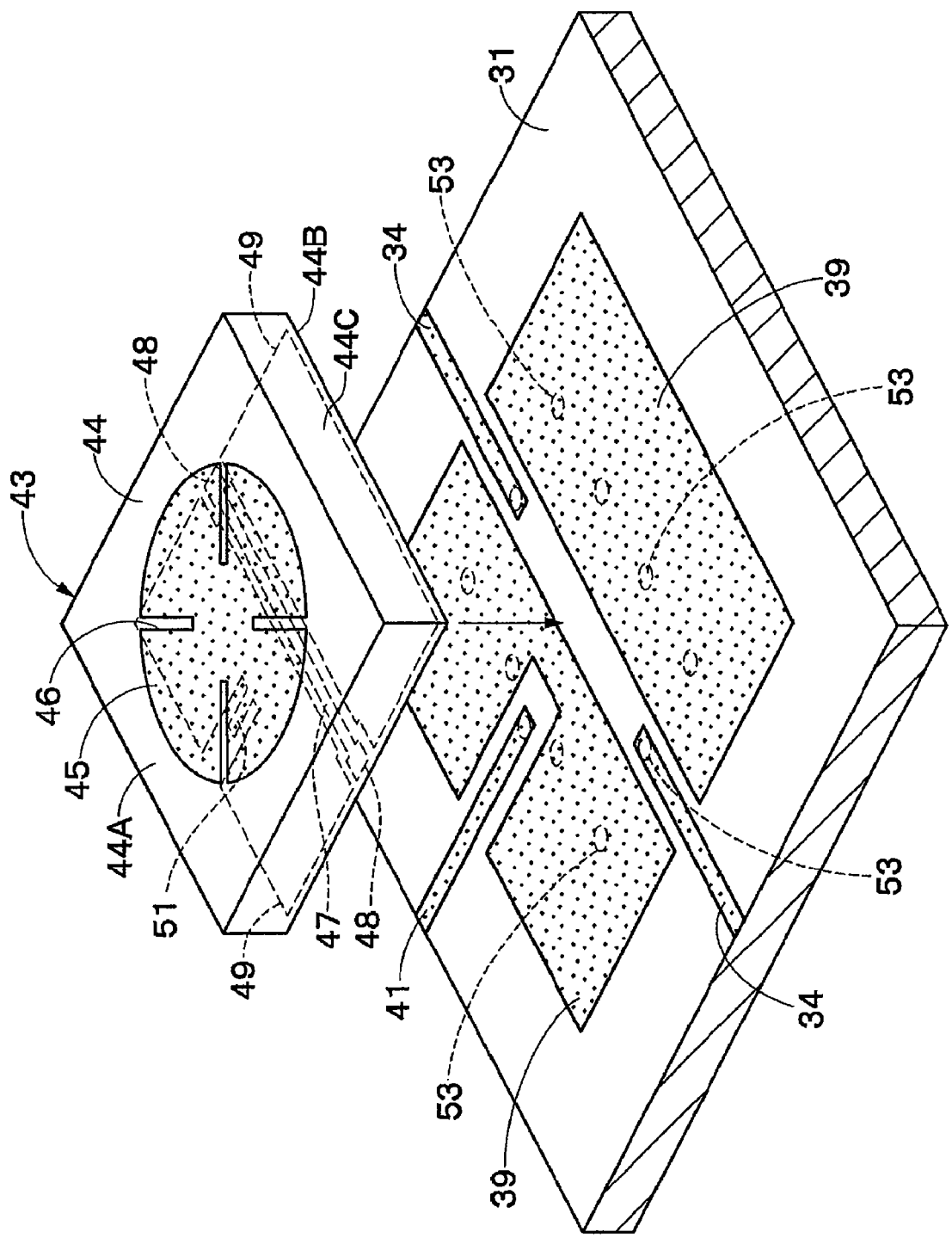
FIG. 24 is an exploded perspective view illustrating a TM010-mode resonator and an oscillation circuit substrate shown in FIG. 23.
Figure 25:
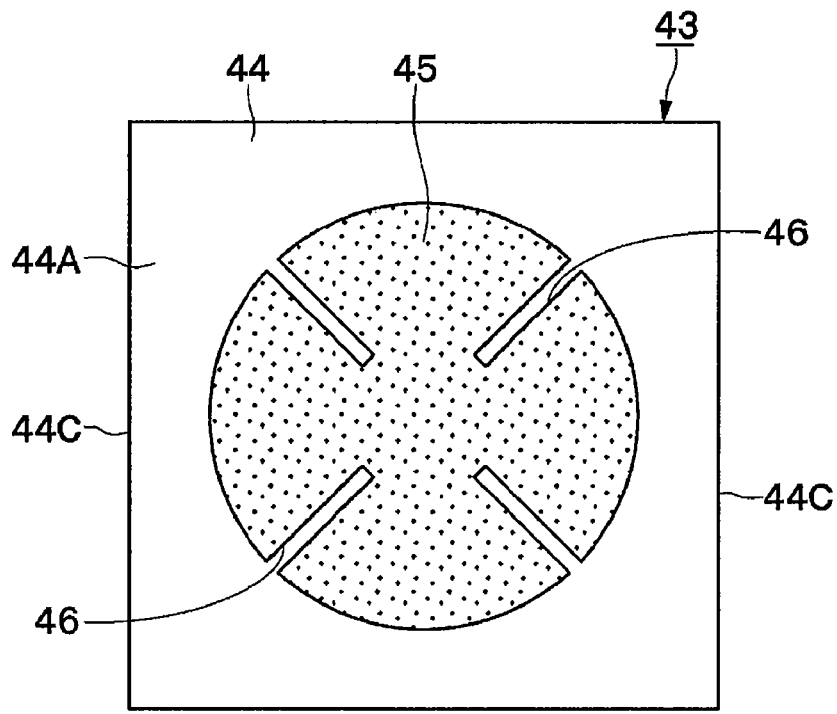
FIG. 25 is a plan view illustrating the TM010-mode resonator shown in FIG. 23.
Figure 26:
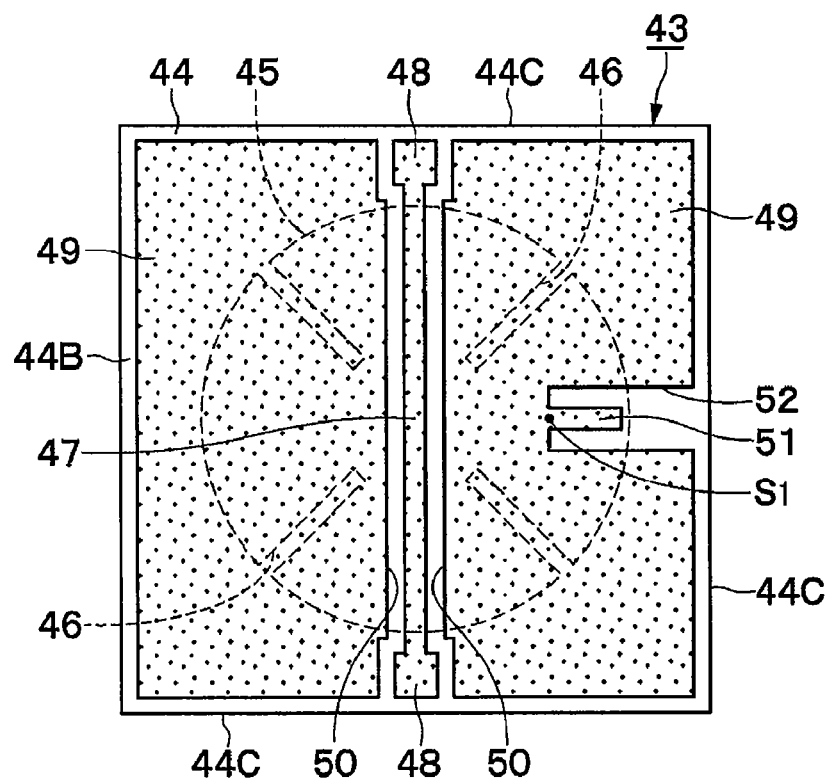
FIG. 26 is a bottom plan view illustrating the TM010-mode resonator shown in FIG. 23.

In the second embodiment, although the two coupling electrodes 27 are arranged on the back surface 22B of the dielectric substrate 22, only one coupling electrode 27 may be arranged. As a seventh modification shown in FIG. 22, three or more coupling electrodes 27 may be arranged.

In the second embodiment, although the cutout portions 24 are arranged on the substantially circular electrode 23 for controlling the resonant frequency for other resonance modes, the cutout portions may be omitted. Furthermore, the shape of the substantially circular electrode 23 is not limited to a circular shape, and may be an oval shape.

Referring to FIGS. 23 to 26, an oscillation apparatus according to a third embodiment of the present invention will now be described. In this embodiment, two back-surface electrodes are arranged on either side of the coupling line serving as a magnetic-field coupling section and are arranged on a back surface of the dielectric substrate of the TM010-mode resonator. Furthermore, one of the back-surface electrodes has a coupling electrode which has a short-circuit point surrounded by an opening portion and which serves as another magnetic-field coupling section, and the oscillation apparatus is configured using a TM010-mode resonator.

An oscillation circuit substrate 31 serving as an external substrate is made of an dielectric material. An oscillation circuit unit 32 and a frequency control circuit unit 40, which will be described later, are arranged on the oscillation circuit substrate 31 serving as an external substrate, and furthermore, a TM010-mode resonator 43 is implemented on a surface of the oscillation circuit substrate 31.

The oscillation circuit unit 32 is arranged on the surface of an oscillation circuit substrate 31. The oscillation circuit unit 32 includes a field-effect transistor 33 (hereinafter referred to as FET 33) and first and second micro-strip lines 34. The oscillation circuit unit 32 receives a power-supply voltage through a power-supply terminal 31A, oscillates signals having a predetermined oscillation frequency set by the TM010-mode resonator 43, which will be described hereinafter, and outputs the signals through an output terminal 31B.

A gate terminal G of the FET 33 is connected to a base end of the first micro-strip line 34. A source terminal S of the FET 33 is connected to a bias resistor 35 and a stub 36. A drain terminal D of the FET 33 is connected to the power-supply terminal 31A and also connected to the output terminal 31B through a coupled line 37 used for interrupting a direct current.

The micro-strip lines 34 serve as signal lines and the first and second micro-strip lines 34 are arranged with the TM010-mode resonator 43 interposed therebetween. The first and second micro-strip lines 34 are arranged in positions other than positions facing a coupling line 47 of the TM010-mode resonator 43, and are linearly arranged. The first and second micro-strip lines 34 are connected to each other through the coupling line 47, and a terminal resistor 38 is connected to an end of the second micro-strip line 34.

As with the case of the ground electrodes 13 according to the first embodiment, the two ground electrodes 39 are arranged on either side in a width direction of the micro-strip lines 34. The two ground electrodes 39 are arranged either side in the width direction of a portion of the TM010-mode resonator 43 facing the coupling line 47, and face two corresponding back-surface electrodes 49. The two ground electrodes 39 are connected to ground electrodes (not shown) arranged on a back surface of the oscillation circuit substrate 31 through via holes, for example.

The frequency control circuit unit 40 is arranged on the surface of the oscillation circuit substrate 31. The frequency control circuit unit 40 mainly includes a micro-strip line 41 serving as a signal line and a variable capacitor diode 42 (varactor diode) serving as a modulation element. The micro-strip line 41 is connected to a coupling electrode 51 at one end thereof and connected to the variable capacitor diode 42 at the other end thereof. The variable capacitor diode 42 is connected to the micro-strip line 41 at the cathode terminal thereof and connected to the ground at the anode terminal thereof.

The frequency control circuit unit 40 controls oscillation frequency (resonant frequency) by changing the capacitance in the variable capacitor diode 42 in accordance with a control voltage applied to a control-input terminal 31C.

The TM010-mode resonator 43 is connected to the oscillation circuit unit 32 and the frequency control circuit unit 40. The TM010-mode resonator 43 includes a dielectric substrate 44, a substantially circular electrode 45, and back-surface electrodes 49, and is stacked on the surface of the oscillation circuit substrate 31.

The dielectric substrate 44 has a substantially square plate shape. The substantially circular electrode 45 is arranged on a surface 44A of the dielectric substrate 44 so as to be located at the center of the dielectric substrate 44. The substantially circular electrode 45 is made of a dielectric thin film and has a diameter corresponding to a value obtained in accordance with a resonant frequency in the dielectric substrate 44. As with the case of the substantially circular electrode 3 according to the first embodiment, the substantially circular electrode 45 has four cutout portions 46 which are radially arranged.

The coupling line 47 serves as a first magnetic-field coupling section. Substantially as with the case of the coupling line 5 according to the first embodiment, the coupling line 47 extends through a portion which is located on a back surface 44B of the dielectric substrate 44 and which faces the substantially circular electrode 45 toward an end portion of the dielectric substrate 44 (an end face 44C). Furthermore, the coupling line 47 linearly extends along the diameter of the substantially circular electrode 45 through the axis O of the substantially circular electrode 45. The coupling line 47 has connection portions 48 at both ends thereof used for connecting the micro-strip lines 34 of the oscillation circuit unit 32.

The back-surface electrodes 49 are arranged on the back surface 44B of the dielectric substrate 44 and are arranged either side of the coupling line 47 in the width direction. The two back-surface electrodes 49 cover the entire back surface 44B of the dielectric substrate 44, face the substantially circular electrode 45 with the dielectric substrate 44 interposed therebetween, and are connected to the ground electrodes 39 of the oscillation circuit unit 32. A gap 50 having a predetermined width is formed between the coupling line 47 and the back-surface electrodes 49.

A coupling electrode 51 serves as a second magnetic-field coupling section. As with the coupling electrodes 27 according to the second embodiment, the coupling electrode 51 is arranged so as to face the substantially circular electrode 45 and arranged on one of the back-surface electrodes 49 in the width direction of the coupling line 47. The coupling electrode 51 is surrounded by a U-shaped open portion 52 (cutout portion) which is formed at an edge of the back-surface electrodes 49 and which has a band-like shape (tongue-like shape). The coupling electrode 51 extends in the radial direction of the substantially circular electrode 45 from the center toward the edge of the back-surface electrodes 49. A tip of the coupling electrode 51 is an open end which is surrounded by the U-shaped open portion 52 whereas a base end of the coupling electrode 51 serves as a short-circuit point S1 connected to the back-surface electrodes 49. The short-circuit point S1 is sandwiched between portions of the open portion 52 in the width direction. The short-circuit point S1 is arranged in the vicinity of a portion of the TM010-mode resonator 43 where the magnitude of a magnetic-field is large, that is, a portion where the short-circuit point S1 is strongly coupled with the TM010-mode resonator 43.

The both ends (connection portions 48) of the coupling line 47 of the TM010-mode resonator 43 are connected to the micro-strip lines 34 arranged on the oscillation circuit unit 32 using bumps 53, and the back-surface electrodes 49 are connected to the ground electrodes 39 arranged on the oscillation circuit unit 32 using the bumps 53. The coupling electrode 51 of the TM010-mode resonator 43 is connected to the micro-strip line 41 of the frequency control circuit unit 40 using the bumps 53.

The oscillation apparatus according to this embodiment has the configuration described above, and an operation thereof will now be described.

When a driving voltage is applied to the power-supply terminal 31A, a signal based on a resonant frequency of the TM010-mode resonator 43 is supplied to the gate terminal G of the FET 33. Since the oscillation circuit unit 32 and the TM010-mode resonator 43 constitute a reaction oscillation circuit, the FET 33 amplifies the signal supplied on the basis of the resonant frequency of the TM010-mode resonator 43 and outputs the amplified signal through the output terminal 31B.

Since the frequency control circuit unit 40 including the variable capacitor diode 42 is connected to the TM010-mode resonator 43, the resonant frequency of the TM010-mode resonator 43 is variably set in accordance with the value of a control voltage to be applied to the control-input terminal 31C. Therefore, the entire oscillation apparatus functions as a voltage-controlled oscillator (VCO).

Accordingly, in addition to the coupling line 47 which extends across the dielectric substrate 44 through the axis O of the substantially circular electrode 45 on the TM010-mode resonator 43, the coupling electrode 51 is arranged on one of the back-surface electrodes 49 which are arranged on either side of the coupling line 47 in the width direction in this embodiment. As with the first embodiment, the TM010-mode resonator 43 serves as a reaction resonator using the coupling line 47. In addition, since the coupling electrode 51 is connected to the frequency control circuit unit 40, the resonant frequency of the TM010-mode resonator 43 may be externally controlled. Consequently, a voltage-controlled oscillator is provided employing the TM010-mode resonator 43.

Furthermore, since the coupling line 47 and the coupling electrode 51 are arranged on the dielectric substrate 44 of the TM010-mode resonator 43, variation of the amount of coupling between the TM010-mode resonator 43 and the coupling line 47 and the amount of coupling between the TM010-mode resonator 43 and the coupling electrode 51 is reduced. Accordingly, the characteristics of individual oscillation apparatuses can be maintained substantially stable. Moreover, since the frequency control circuit unit 40 and the terminal resistor 38 may be removed from the dielectric substrate 44 of the TM010-mode resonator 43, the expensive dielectric substrate 44, which has a high dielectric constant and therefore is expensive, may be miniaturized. Since the variations of the characteristics are reduced, mass production of the oscillation apparatus is enhanced. Furthermore, since a compact dielectric substrate 44 is used, the production cost is reduced.

Figure 27:
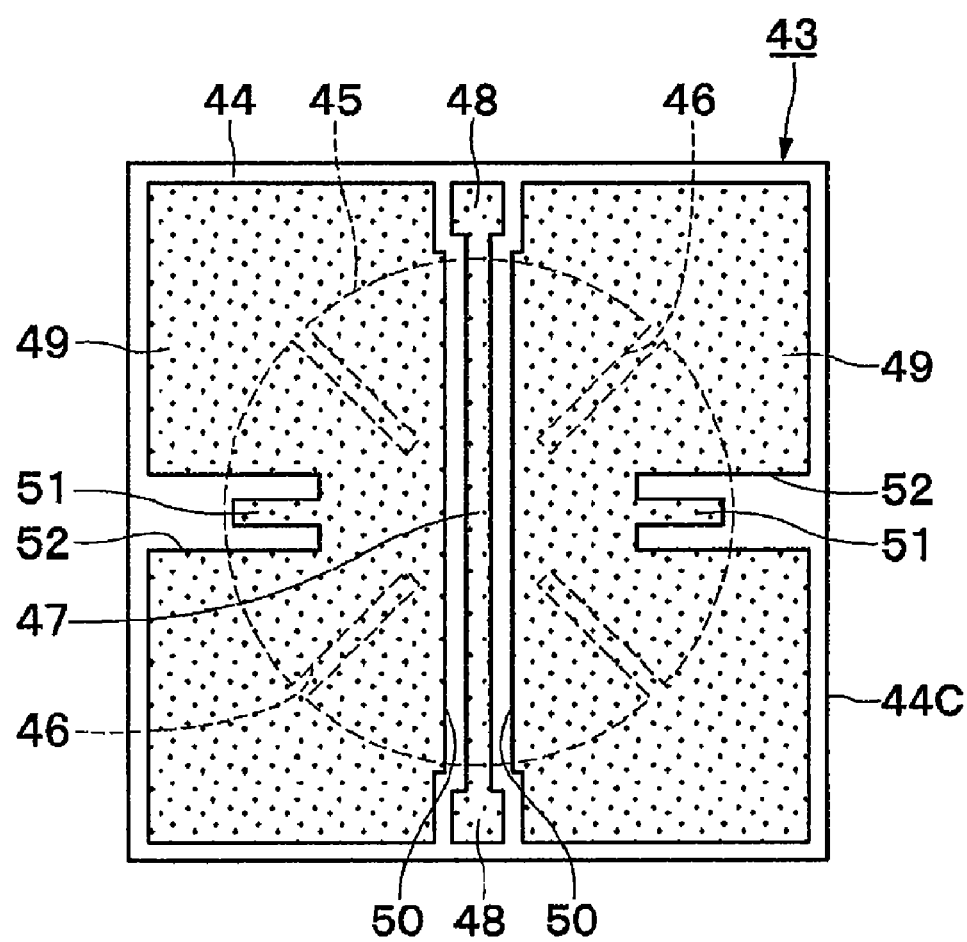
FIG. 27 is a bottom plan view illustrating a TM010-mode resonator according to an eighth modification.

Note that in the third embodiment, one coupling electrode 51 is arranged on one of the back-surface electrodes 49 which are arranged either side of the coupling line 47 in the width direction, and is connected to the frequency control circuit unit 40 including a variable element (the variable capacitor diode 42). However, the present invention is not limited to this. As shown in FIG. 27 as an eighth modification, two coupling electrodes 51 may be arranged on both of the back-surface electrodes 49 which are arranged either side of the coupling line 47 in the width direction, one of the coupling electrodes 51 may be connected to the frequency control circuit unit 40 (the variable element) and the other coupling electrode 51 may be connected to a stub used for controlling frequencies.

The TM010-mode resonator 43 according to the third embodiment is constituted by a combination of the TM010-mode resonator 1 according to the first embodiment and the TM010-mode resonator 21 according to the second embodiment. However, the present invention is not limited to this. For example, a TM010-mode resonator employed for a oscillation apparatus may be configured by a combination of the TM010-mode resonators 1 and 21 according to the first to seventh modifications.

Figure 28:
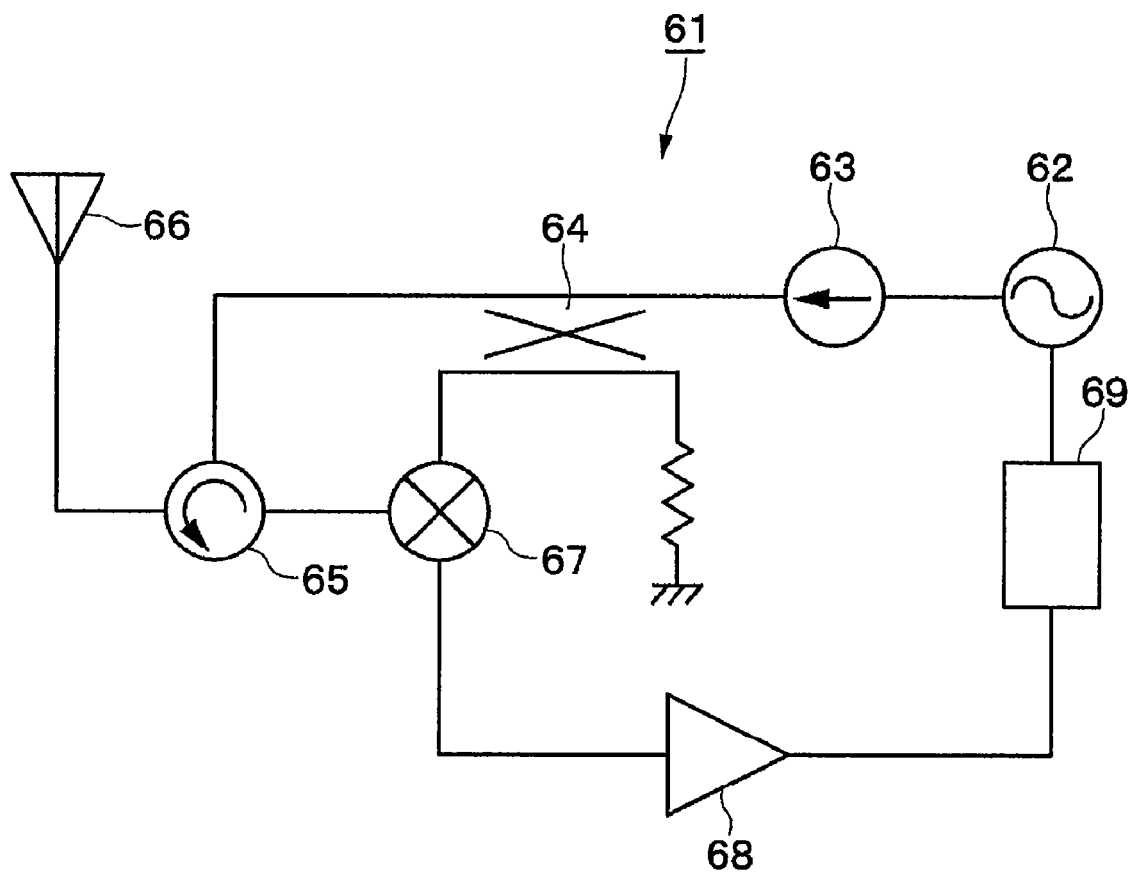
FIG. 28 is a block diagram illustrating a radar apparatus according to a fourth embodiment.

Referring next to FIG. 28, a fourth embodiment will be described. A characteristic of this embodiment is that a radar apparatus serving as a transmission/reception apparatus is configured using an oscillation apparatus including the dielectric resonance apparatus according to the invention.

A radar apparatus 61 includes an oscillation apparatus 62, a coupler 64, a mixer 67, and a signal processing circuit 69, which will be described later, and serves as a millimeter-wave radar module.

As with the third embodiment, the oscillation apparatus 62 is constituted by a VCO employing the dielectric resonance apparatus according to the invention, and is connected to an antenna 66 through an isolator 63, the coupler 64, and a circulator 65. With this configuration, an high-frequency signal output from the oscillation apparatus 62 is externally transmitted through the antenna 66.

The antenna 66 is connected to the mixer 67 through the circulator 65, and an output terminal of the mixer 67 is connected to the signal processing circuit 69 through a low-noise amplifier 68 (hereinafter referred to as an LNA 68). With this configuration, a high-frequency signal received by the antenna 66 is down-converted into an intermediate frequency signal, and thereafter the converted signal is processed in the signal processing circuit 69.

The radar apparatus 61 according to this embodiment has the configuration as described above, and an operation thereof will now be described.

A high-frequency signal output from the oscillation apparatus 62 is supplied to the antenna 66 through the isolator 63, the coupler 64 and the circulator 65. Here, the antenna 66 emits a millimeter-wave signal as a sharp beam to thereby externally transmit the signal. When the millimeter-wave signal rays fall on an object, such as a vehicle, a reflection wave from the vehicle is incident on the antenna 66. The antenna 66 leads a reception signal obtained on the basis of the reflection to the mixer 67 through the circulator 65. Accordingly, since the reception signal is input to the mixer 67, and in addition, a local signal, which is a part of a transmission signal from the coupler 64, is input from the coupler 64, the mixer 67 outputs a beat signal, which is an oscillation frequency signal obtained from a difference between the reception signal and the local signal, as an intermediate frequency signal. The intermediate frequency signal is amplified by the LNA 68 and supplied to the signal processing circuit 69. The signal processing circuit 69 performs digital-data column conversion and further performs FFT (fast Fourier transformation) processing on the intermediate frequency signal, whereby an oscillation frequency spectrum of the beat signal is obtained. Consequently, the distance and the relative velocity to the object are obtained from the relationship between a modulation signal supplied to the signal processing circuit 69 and the intermediate frequency signal.

According to this embodiment, since the oscillation apparatus 62 using the dielectric resonance apparatus according to the embodiment is used to configure a communication apparatus, variation of electric characteristics of individual radar apparatuses 61 can be reduced, and the production cost may be reduced.

Note that in the fourth embodiment, although the oscillation apparatus 62 using the dielectric resonance apparatus according to the present invention is employed for the radar apparatus 61, the oscillation apparatus 62 may be employed for a communication device, for example.

The invention claimed is:

1. A dielectric resonance apparatus, comprising:
    a TM010-mode resonator comprising a dielectric substrate having a first electrode arranged on a front surface and a second electrode arranged on a back surface thereof, wherein the electrode arranged on the front surface is substantially circular;
    an external substrate implemented on a plane of the back surface of the dielectric substrate and having a surface facing the back surface of the dielectric substrate,
    a pair of signal lines arranged on said surface of the external substrate, each of which has an end portion and each of which is connected to the TM010-mode resonator, and
    a magnetic-field coupler arranged on the back surface of the dielectric substrate and adapted to magnetically couple the TM010-mode resonator to the signal lines,
    wherein the magnetic-field coupler comprises a coupling line having opposite ends electrically connected to the signal lines and which extends through a position facing the substantially circular electrode toward an end portion of the dielectric substrate, and
    wherein the second electrode comprises two back-surface electrodes each of which is disposed on a different side of the coupling line in a width direction and spaced therefrom such that an isolation gap is provided between the coupling line and each of the two back-surface electrodes.

2. The dielectric resonance apparatus according to claim 1, wherein the coupling line passes through an axis of the substantially circular electrode.

3. The dielectric resonance apparatus according to claim 1, wherein a width of the coupling line defines an amount of coupling between the TM010-mode resonator and the signal lines.

4. The dielectric resonance apparatus according to claim 1, wherein a width of the gap between the coupling line and each of the two back-surface electrodes defines an amount of coupling between the TM010-mode resonator and the signal lines.

5. The dielectric resonance apparatus according to claim 1, wherein the signal lines, other than at the end portion thereof, and a ground electrode are arranged on the surface of the external substrate at portions other than portions facing the coupling line of the TM010-mode resonator,
wherein the signal lines are connected to end portions of the coupling line of the TM010-mode resonator by bumps, and
wherein the ground electrode is connected to at least one of the two back-surface electrode of the TM010-mode resonator by a bump.

6. The dielectric resonance apparatus according to claim 1, wherein a second magnetic-field coupler is disposed on the back surface of the dielectric substrate of the TM010-mode resonator, and
wherein the second magnetic-field coupler comprises one of the two back-surface electrodes and has a short-circuit point.

7. The dielectric resonance apparatus according to claim 1, wherein the circular electrode has at least two non-electrode portions extending from different points on the circumference of the circular electrode toward but not reaching the axis of the circular electrode.

8. The dielectric resonance apparatus according to claim 7, wherein the non-electrode portions of the circular electrode are symmetrically disposed.

9. The dielectric resonance apparatus according to claim 1, wherein the external substrate has a dielectric constant lower than that of the dielectric substrate.

10. An oscillation apparatus containing the dielectric resonance apparatus set forth in claim 1.

11. A transmission/reception apparatus containing the dielectric resonance apparatus set forth in claim 1.

12. A dielectric resonance apparatus, comprising:
a TM010-mode resonator comprising a dielectric substrate having a first electrode arranged on a front surface and a second electrode arranged on a back surface thereof, wherein the electrode arranged on the front surface is substantially circular;
an external substrate implemented on a plane of the back surface of the dielectric substrate and having a surface facing the back surface of the dielectric substrate,
a pair of signal lines arranged on said surface of the external substrate, each of which has an end portion and each of which is connected to the TM010-mode resonator, and
a magnetic-field coupler arranged on the back surface of the dielectric substrate and adapted to magnetically couple the TM010-mode resonator to the signal lines,
wherein an electrode disposed on the back surface of the dielectric substrate faces the substantially circular electrode,
wherein the magnetic-field coupler comprises a pair of coupling electrodes each of which has an end portion surrounded by a U-shaped non-electrode portion and a short-circuit point disposed in the end portion, and
wherein each of the coupling electrodes are electrically connected to the signal lines on the external substrate.

13. The dielectric resonance apparatus according to claim 12,
wherein the second electrode has an end portion surrounded by a U-shaped non-electrode portion, and
wherein the coupling electrodes have tip ends surrounded by the U-shaped non-electrode portions and base ends, of which the tip ends are connected to the signal lines on the external substrate, and the base ends are connected to the second electrode and serve as the short-circuit points.

14. The dielectric resonance apparatus according to claim 12, wherein the short circuit points are disposed distant from a portion of the TM010-mode resonator where a magnitude of a magnetic field is largest.

15. The dielectric resonance apparatus according to claim 12, wherein a width of the U-shaped portion adjacent the short-circuit point of the coupling electrodes is different from a width of non-adjacent parts of the U-shaped portion.

16. The dielectric resonance apparatus according to claim 12, wherein the U-shaped non-electrode portion adjacent the short circuit point is wider than at other portions of the coupling electrode.

17. An oscillation apparatus containing the dielectric resonance apparatus set forth in claim 12.

18. A transmission/reception apparatus containing the dielectric resonance apparatus set forth in claim 12.

* * * * *